(12) United States Patent
Yashima et al.

(10) Patent No.: US 8,466,440 B2
(45) Date of Patent: Jun. 18, 2013

(54) CHARGED PARTICLE BEAM DRAWING APPARATUS AND CONTROL METHOD THEREOF

(75) Inventors: Jun Yashima, Kanagawa (JP); Yasuo Kato, Kanagawa (JP); Akihito Anpo, Tokyo (JP)

(73) Assignee: NuFlare Technology, Inc., Numazu-shi (JP)

( * ) Notice: Subject to any disclaimer, the term of this patent is extended or adjusted under 35 U.S.C. 154(b) by 46 days.

(21) Appl. No.: 13/163,111

(22) Filed: Jun. 17, 2011

(65) Prior Publication Data

US 2012/0001097 A1 Jan. 5, 2012

(30) Foreign Application Priority Data

Jun. 30, 2010 (JP) ................................. 2010-149000

(51) Int. Cl.
*G21K 5/10* (2006.01)
*G03F 7/00* (2006.01)

(52) U.S. Cl.
USPC .................................. 250/492.22; 250/492.1

(58) Field of Classification Search
USPC ............................ 250/492.1, 492.22; 430/30
See application file for complete search history.

(56) References Cited

U.S. PATENT DOCUMENTS

| | | | |
|---|---|---|---|
| 7,740,991 B2 * | 6/2010 | Emi et al. ........................... | 430/4 |
| 7,900,185 B2 * | 3/2011 | Kimura et al. ................. | 716/139 |
| 8,309,283 B2 * | 11/2012 | Kato et al. ............... | 250/492.22 |
| 2003/0026472 A1 * | 2/2003 | Abe ............................. | 382/144 |
| 2007/0187624 A1 * | 8/2007 | Suzuki et al. ............ | 250/492.22 |
| 2007/0194250 A1 * | 8/2007 | Suzuki et al. .............. | 250/492.2 |
| 2011/0089345 A1 * | 4/2011 | Komagata et al. ........ | 250/492.22 |
| 2011/0121208 A1 * | 5/2011 | Nakayamada et al. .. | 250/492.22 |
| 2012/0025108 A1 * | 2/2012 | Fujimura et al. ......... | 250/492.22 |

FOREIGN PATENT DOCUMENTS

| | | |
|---|---|---|
| JP | 10-261557 | 9/1998 |
| JP | 2001-189262 | 7/2001 |
| JP | 2007-220728 | 8/2007 |
| JP | 2007220728 A * | 8/2007 |
| JP | 2009-260250 | 11/2009 |
| JP | 2010-73918 | 4/2010 |

OTHER PUBLICATIONS

U.S. Appl. No. 13/288,530, filed Nov. 3, 2011, Yashima.
U.S. Appl. No. 13/235,432, filed Sep. 18, 2011, Nakayamada, et al.

* cited by examiner

*Primary Examiner* — David A Vanore
*Assistant Examiner* — Wyatt Stoffa
(74) *Attorney, Agent, or Firm* — Oblon, Spivak, McClelland, Maier & Neustadt, L.L.P.

(57) ABSTRACT

A charged particle beam drawing apparatus applies a predetermined dose of a charged particle beam for drawing patterns corresponding to figures included in a drawing data, in a whole of a drawing area of a workpiece, before a result of calculation of a fogging effect correction dose is obtained, wherein a proximity effect correction dose is incorporated in the predetermined dose, and the fogging effect correction dose is not incorporated in the predetermined dose, then, the charged particle beam drawing apparatus applies a predetermined dose of the charged particle beam for drawing the patterns which overlap the patterns drawn before the result of calculation of the fogging effect correction dose is obtained, in the whole of the drawing area of the workpiece, after the calculation of the fogging effect correction dose, wherein the proximity effect correction dose and the fogging effect correction dose are incorporated in the predetermined dose.

4 Claims, 12 Drawing Sheets

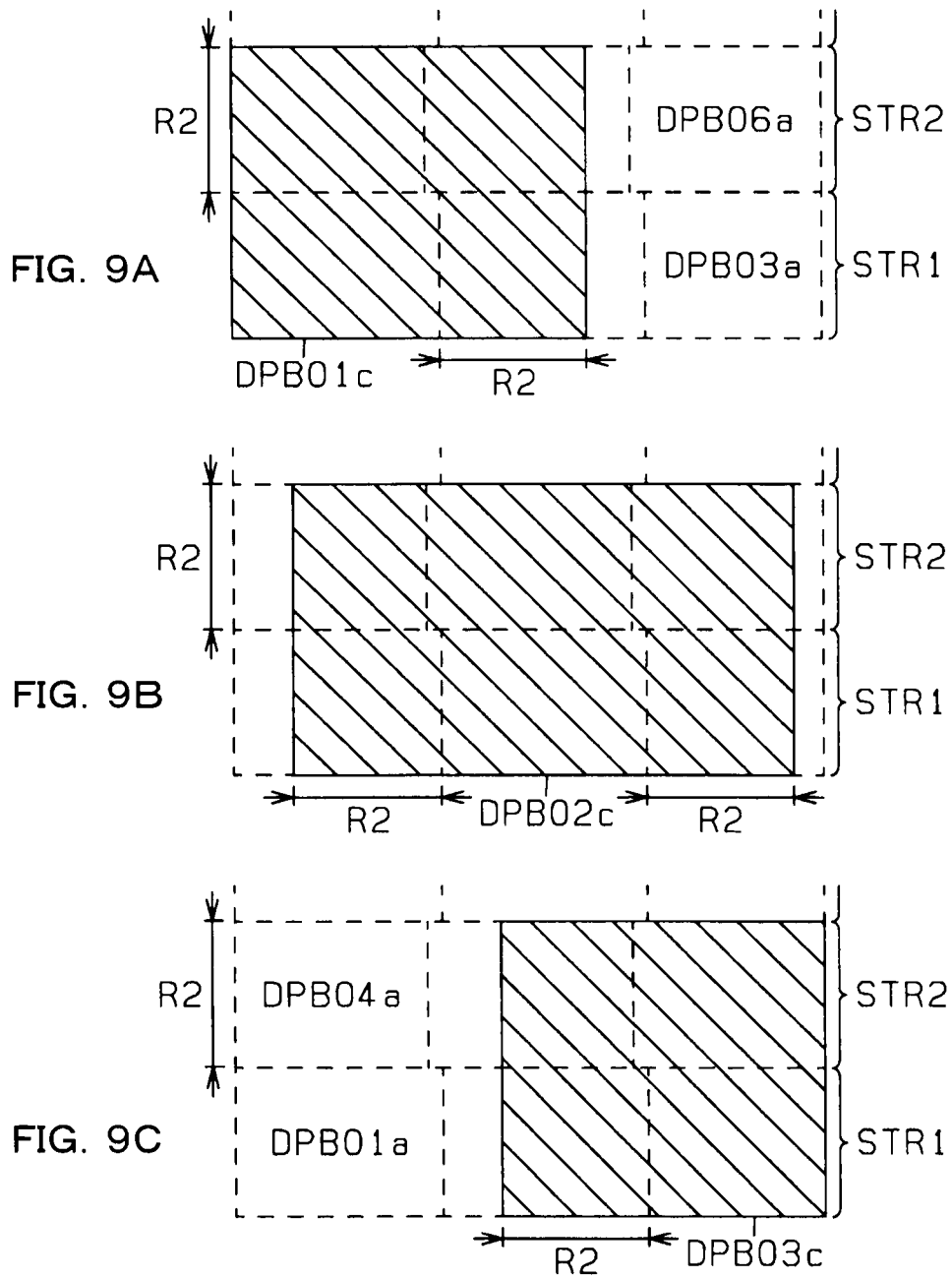

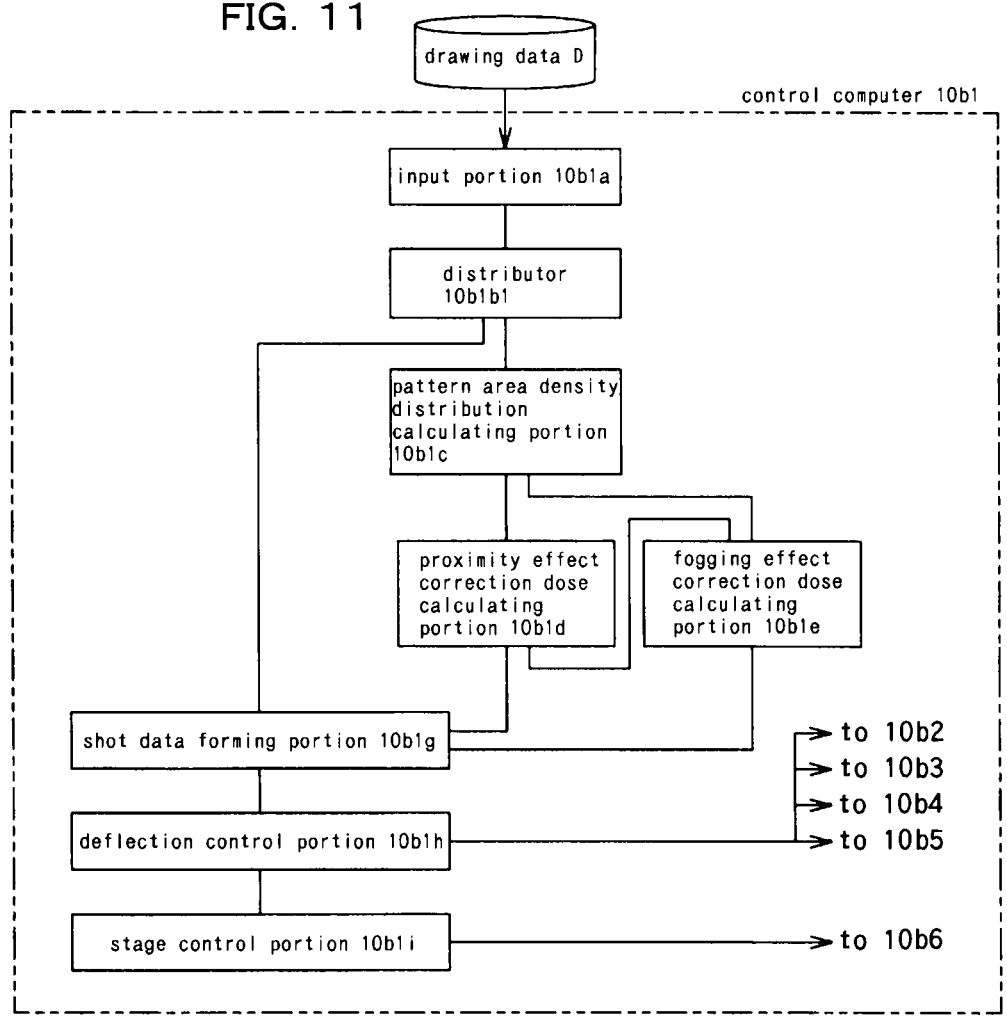

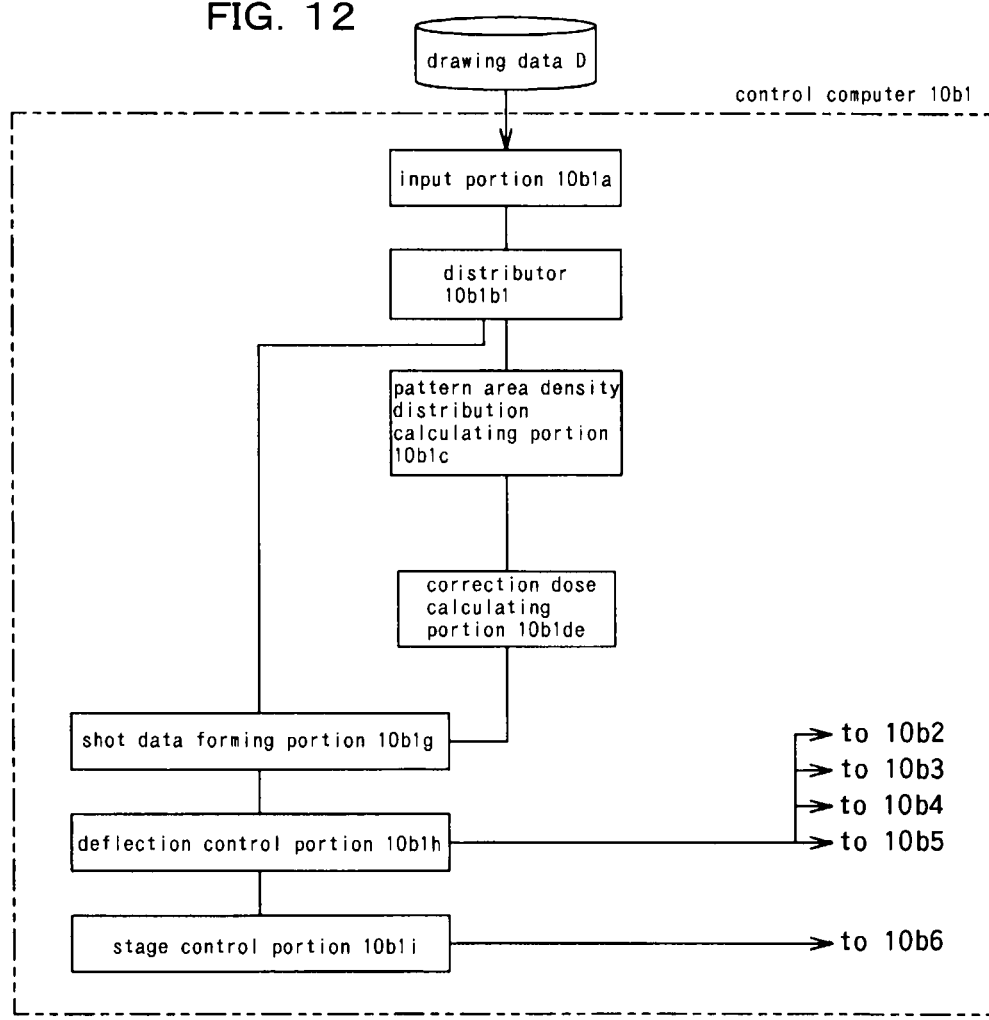

CHARGED PARTICLE BEAM DRAWING APPARATUS AND CONTROL METHOD THEREOF

CROSS-REFERENCE TO RELATED APPLICATION

This application is based upon and claims the benefit of priority from the prior Japanese Patent Application No. 2010-149000 filed on Jun. 30, 2010 in Japan, the entire contents of which are incorporated herein by reference.

BACKGROUND OF THE INVENTION

1. Field of the Invention

The present invention relates to a charged particle beam drawing apparatus and control method thereof, wherein patterns corresponding to figures included in a drawing data are drawn in a drawing area of a workpiece by means of multi-pass writing, by applying a predetermined dose of a charged particle beam to the workpiece, wherein a resist is applied to an upper surface of the workpiece, and wherein a proximity effect correcting dose and a fogging effect correction dose are incorporated in the predetermined dose.

2. Description of Related Art

As is known in the prior art, in a charged particle beam drawing apparatus, patterns corresponding to a pattern data are drawn in a drawing area of a workpiece by applying a predetermined dose of a charged particle beam to the workpiece, wherein a resist is applied to an upper surface of the workpiece, and wherein a proximity effect correction dose and a fogging effect correction dose are incorporated in the predetermined dose. For example, the charged particle beam drawing apparatus in the prior art is described in Japanese Unexamined Patent Publication No. 2007-220728.

In the charged particle beam drawing apparatus described in Japanese Unexamined Patent Publication No. 2007-220728, patterns corresponding to the pattern data are drawn in a whole of the drawing area of the workpiece by applying the predetermined dose of the charged particle beam to the workpiece. In detail, in a first embodiment of the charged particle beam drawing apparatus described in Japanese Unexamined Patent Publication No. 2007-220728, calculation concerning proximity effect correction and fogging effect correction is performed, while the patterns are drawn in the drawing area of the workpiece.

In the charged particle beam drawing apparatus described in Japanese Unexamined Patent Publication No. 2007-220728, pattern area density distribution and a proximity effect correction dose are used for calculation of the fogging effect correction dose, wherein the pattern area density distribution and the proximity effect correction dose are calculated by using meshes, wherein a size of each mesh is 5 $\mu m \times 5$ $\mu m$. Accordingly, the charged particle beam drawing apparatus described in Japanese Unexamined Patent Publication No. 2007-220728, can achieve higher accuracy of the fogging effect correction dose than a charged particle beam drawing apparatus, in which a value of a proximity effect correction dose used for a calculation of a fogging effect correction dose, is constant. (see paragraphs 0042, 0071, 0073 of Japanese Unexamined Patent Publication No. 2007-220728).

In a charged particle beam drawing apparatus in the prior art, such as the charged particle beam drawing apparatus described in Japanese Unexamined Patent Publication No. 2007-220728, it is intended that the calculation concerning the proximity effect correction and the fogging effect correction is performed while the patterns are drawn in the drawing area of the workpiece. However, in the charged particle beam drawing apparatus in the prior art, such as the charged particle beam drawing apparatus described in Japanese Unexamined Patent Publication No. 2007-220728, before drawing of patterns included in a block frame used for a shot dividing process and having a drawing order priority, is started, it is required to complete the shot dividing process corresponding to the block frame used for the shot dividing process and having the drawing order priority, pattern area density distribution calculation and proximity effect correction dose calculation corresponding to a block frame used for the proximity effect correction and having the drawing order priority, wherein the pattern area density distribution calculation and the proximity effect correction dose calculation are performed by using meshes, wherein a size of each mesh is 1 $\mu m \times 1$ $\mu m$, and wherein the block frame used for the proximity effect correction is slightly larger than the block frame used for the shot dividing process. Also, in the charged particle beam drawing apparatus in the prior art, such as the charged particle beam drawing apparatus described in Japanese Unexamined Patent Publication No. 2007-220728, before the drawing of the patterns included in the block frame used for the shot dividing process and having the drawing order priority, is started, it is required to complete pattern area density distribution calculation and proximity effect correction dose calculation corresponding to a block frame used for the fogging effect correction and having the drawing order priority, wherein the pattern area density distribution calculation and the proximity effect correction dose calculation are performed by using meshes, wherein a size of each mesh is 5 $\mu m \times 5$ $\mu m$, and wherein the block frame used for the fogging effect correction is fairly larger than the block frame used for the shot dividing process. Also, in the charged particle beam drawing apparatus in the prior art, such as the charged particle beam drawing apparatus described in Japanese Unexamined Patent Publication No. 2007-220728, before the drawing of the patterns included in the block frame used for the shot dividing process and having the drawing order priority, is started, it is required to complete pattern area density distribution calculation and fogging effect correction dose calculation corresponding to the block frame used for the fogging effect correction and having the drawing order priority, wherein the pattern area density distribution calculation and the fogging effect correction dose calculation are performed by using meshes, wherein a size of each mesh is 1 $\mu m \times 1$ $\mu m$.

Therefore, in the charged particle beam drawing apparatus in the prior art, such as the charged particle beam drawing apparatus described in Japanese Unexamined Patent Publication No. 2007-220728, actually, the drawing of the patterns included in the block frame used for the shot dividing process and having the drawing order priority, cannot be immediately started.

SUMMARY OF THE INVENTION

An object of the present invention is to provide an charged particle beam drawing apparatus and control method thereof, which can improve accuracy of a fogging effect correction dose, and can immediately start drawing of patterns included in a block frame having drawing order priority.

In detail, the object of the present invention is to provide the charged particle beam drawing apparatus and control method thereof, which can decrease a whole of processing load of distributors, transfer time of a data to the distributors, and a whole of processing load of proximity effect correction and fogging effect correction.

In accordance with one aspect of the present invention, a charged particle beam drawing apparatus, comprising: a pattern area density distribution calculating portion for calculating a first pattern area density distribution used for calculation of a proximity effect correction dose, and a second pattern area density distribution used for calculation of a fogging effect correction dose, wherein the first pattern area density distribution has a first mesh size, and wherein the second pattern area density distribution has a second mesh size, and wherein the second mesh size is different from the first mesh size; a proximity effect correction dose calculating portion for calculating the proximity effect correction dose, on the basis of the first pattern area density distribution calculated by the pattern area density distribution calculating portion; a fogging effect correction dose calculating portion for calculating the fogging effect correction dose, on the basis of the proximity effect correction dose calculated by the proximity effect correction dose calculating portion, and the second pattern area density distribution calculated by the pattern area density distribution calculating portion; a drawing portion for drawing patterns corresponding to figures included in a drawing data, in a drawing area of a workpiece, by irradiating the workpiece with a charged particle beam, wherein the workpiece is formed by applying a resist to an upper surface of the workpiece, and wherein after the calculation of the proximity effect correction dose by the proximity effect correction dose calculating portion, and before a result of the calculation of the fogging effect correction dose by the fogging effect correction dose calculating portion is obtained, a predetermined dose of the charged particle beam is applied for drawing the patterns in a whole of the drawing area of the workpiece, wherein the proximity effect correction dose is incorporated in the predetermined dose, and the fogging effect correction dose is not incorporated in the predetermined dose, and wherein after the calculation of the proximity effect correction dose by the proximity effect correction dose calculating portion, and after the calculation of the fogging effect correction dose by the fogging effect correction dose calculating portion, a predetermined dose of the charged particle beam is applied for drawing the patterns in the whole of the drawing area of the workpiece, wherein the proximity effect correction dose and the fogging effect correction dose are incorporated in the predetermined dose, and wherein the patterns drawn after the calculation of the fogging effect correction dose overlap the patterns drawn before the result of the calculation of the fogging effect correction dose is obtained, and wherein shape of the patterns drawn after the calculation of the fogging effect correction dose is the same as shape of the patterns drawn before the result of the calculation of the fogging effect correction dose is obtained; a shot data forming portion for performing a shot dividing process and forming a shot data; a first distributor for reading a data of figures corresponding to a first block frame from the drawing data corresponding to the whole of the drawing area of the workpiece, and forming a block frame unit data corresponding to the first block frame, wherein the block frame unit data corresponding to the first block frame is used for the shot dividing process; and a second distributor for reading a data of figures corresponding to a second block frame from the drawing data corresponding to the whole of the drawing area of the workpiece, and forming a block frame unit data corresponding to the second block frame, wherein the second block frame is larger than the first block frame, and wherein the block frame unit data corresponding to the second block frame is used by the pattern area density distribution calculating portion is provided.

In accordance with another aspect of the present invention, a charged particle beam drawing apparatus, comprising: a pattern area density distribution calculating portion for calculating a first pattern area density distribution used for calculation of a proximity effect correction dose, and a second pattern area density distribution used for calculation of a fogging effect correction dose, wherein the first pattern area density distribution has a first mesh size, and wherein the second pattern area density distribution has a second mesh size, and wherein the second mesh size is different from the first mesh size; a proximity effect correction dose calculating portion for calculating the proximity effect correction dose, on the basis of the first pattern area density distribution calculated by the pattern area density distribution calculating portion; a fogging effect correction dose calculating portion for calculating the fogging effect correction dose, on the basis of the proximity effect correction dose calculated by the proximity effect correction dose calculating portion, and the second pattern area density distribution calculated by the pattern area density distribution calculating portion; a drawing portion for drawing patterns corresponding to figures included in a drawing data, in a drawing area of a workpiece, by irradiating the workpiece with a charged particle beam, wherein the workpiece is formed by applying a resist to an upper surface of the workpiece, and wherein before a result of the calculation of the proximity effect correction dose by the proximity effect correction dose calculating portion is obtained, and before a result of the calculation of the fogging effect correction dose by the fogging effect correction dose calculating portion is obtained, a predetermined dose of the charged particle beam is applied for drawing the patterns in a whole of the drawing area of the workpiece, wherein the proximity effect correction dose is not incorporated in the predetermined dose, and the fogging effect correction dose is not incorporated in the predetermined dose, and wherein after the calculation of the proximity effect correction dose by the proximity effect correction dose calculating portion, and after the calculation of the fogging effect correction dose by the fogging effect correction dose calculating portion, a predetermined dose of the charged particle beam is applied for drawing the patterns in the whole of the drawing area of the workpiece, wherein the proximity effect correction dose and the fogging effect correction dose are incorporated in the predetermined dose, and wherein the patterns drawn after the calculation of the proximity effect correction dose and the fogging effect correction dose overlap the patterns drawn before the result of the calculation of the proximity effect correction dose and the fogging effect correction dose is obtained, and wherein shape of the patterns drawn after the calculation of the proximity effect correction dose and the fogging effect correction dose is the same as shape of the patterns drawn before the result of the calculation of the proximity effect correction dose and the fogging effect correction dose is obtained; a shot data forming portion for performing a shot dividing process and forming a shot data; and a distributor for reading a data of figures corresponding to a block frame from the drawing data corresponding to the whole of the drawing area of the workpiece, and forming a block frame unit data corresponding to the block frame, wherein the block frame unit data corresponding to the block frame is used by the pattern area density distribution calculating portion, and is used for the shot dividing process is provided.

In accordance with another aspect of the present invention, a charged particle beam drawing apparatus, comprising: a pattern area density distribution calculating portion for calculating a pattern area density distribution used for calculation of a proximity effect correction dose, and used for calculation of a fogging effect correction dose; a proximity effect correction dose calculating portion for calculating the proximity effect correction dose, on the basis of the pattern area density distribution calculated by the pattern area density distribution calculating portion; a fogging effect correction dose calculating portion for calculating the fogging effect correction dose, on the basis of the proximity effect correction dose calculated by the proximity effect correction dose calculating portion, and the pattern area density distribution calculated by the pattern area density distribution calculating portion; a drawing portion for drawing patterns corresponding to figures included in a drawing data, in a drawing area of a workpiece, by irradiating the workpiece with a charged particle beam, wherein the workpiece is formed by applying a resist to an upper surface of the workpiece, and wherein before a result of the calculation of the proximity effect correction dose by the proximity effect correction dose calculating portion is obtained, and before a result of the calculation of the fogging effect correction dose by the fogging effect correction dose calculating portion is obtained, a predetermined dose of the charged particle beam is applied for drawing the patterns in a whole of the drawing area of the workpiece, wherein the proximity effect correction dose is not incorporated in the predetermined dose, and the fogging effect correction dose is not incorporated in the predetermined dose, and wherein after the calculation of the proximity effect correction dose by the proximity effect correction dose calculating portion, and after the calculation of the fogging effect correction dose by the fogging effect correction dose calculating portion, a predetermined dose of the charged particle beam is applied for drawing the patterns in the whole of the drawing area of the workpiece, wherein the proximity effect correction dose and the fogging effect correction dose are incorporated in the predetermined dose, and wherein the patterns drawn after the calculation of the proximity effect correction dose and the fogging effect correction dose overlap the patterns drawn before the result of the calculation of the proximity effect correction dose and the fogging effect correction dose is obtained, and wherein shape of the patterns drawn after the calculation of the proximity effect correction dose and the fogging effect correction dose is the same as shape of the patterns drawn before the result of the calculation of the proximity effect correction dose and the fogging effect correction dose is obtained; a shot data forming portion for performing a shot dividing process and forming a shot data; and a distributor for reading a data of figures corresponding to a block frame from the drawing data corresponding to the whole of the drawing area of the workpiece, and forming a block frame unit data corresponding to the block frame, wherein the block frame unit data corresponding to the block frame is used by the pattern area density distribution calculating portion, and is used for the shot dividing process is provided.

In accordance with another aspect of the present invention, a charged particle beam drawing apparatus, comprising: a pattern area density distribution calculating portion for calculating a pattern area density distribution used for calculation of a correction dose; a correction dose calculating portion for calculating the correction dose, on the basis of the pattern area density distribution calculated by the pattern area density distribution calculating portion, wherein at least a proximity effect correction dose and a fogging effect correction dose are integrated into the correction dose; a drawing portion for drawing patterns corresponding to figures included in a drawing data, in a drawing area of a workpiece, by irradiating the workpiece with a charged particle beam, wherein the workpiece is formed by applying a resist to an upper surface of the workpiece, and wherein before a result of the calculation of the correction dose by the correction dose calculating portion is obtained, a predetermined dose of the charged particle beam is applied for drawing the patterns in a whole of the drawing area of the workpiece, wherein the correction dose is not incorporated in the predetermined dose, and wherein after the calculation of the correction dose by the correction dose calculating portion, a predetermined dose of the charged particle beam is applied for drawing the patterns in the whole of the drawing area of the workpiece, wherein the correction dose is incorporated in the predetermined dose, and wherein the patterns drawn after the calculation of the correction dose overlap the patterns drawn before the result of the calculation of the correction dose is obtained, and wherein shape of the patterns drawn after the calculation of the correction dose is the same as shape of the patterns drawn before the result of the calculation of the correction dose is obtained; a shot data forming portion for performing a shot dividing process and forming a shot data; and a distributor for reading a data of figures corresponding to a block frame from the drawing data corresponding to the whole of the drawing area of the workpiece, and forming a block frame unit data corresponding to the block frame, wherein the block frame unit data corresponding to the block frame is used by the pattern area density distribution calculating portion, and is used for the shot dividing process is provided.

The correction dose calculating portion of this invention can calculate the correction dose, wherein not only the proximity effect correction dose and the fogging effect correction dose are integrated into the correction dose, but also a dose for correcting loading effect, a dose for correcting microloading effect, a dose for correcting flare effect, a dose for performing a short-range correction caused by difference of dependence of pattern area density according to a type of the workpiece (mask), a type of resist, etc. are integrated into the correction dose, and wherein the dose for performing the short-range correction is smaller than the proximity effect correction dose.

In accordance with another aspect of the present invention, a charged particle beam drawing apparatus, comprising: a pattern area density distribution calculating portion for calculating a pattern area density distribution used for calculation of a correction dose; a correction dose calculating portion for calculating the correction dose on the basis of the pattern area density distribution calculated by the pattern area density distribution calculating portion, and for calculating a proximity effect correction dose on the basis of the pattern area density distribution calculated by the pattern area density distribution calculating portion, wherein at least the proximity effect correction dose and a fogging effect correction dose are integrated into the correction dose; a drawing portion for drawing patterns corresponding to figures included in a drawing data, in a drawing area of a workpiece, by irradiating the workpiece with a charged particle beam, wherein the workpiece is formed by applying a resist to an upper surface of the workpiece, and wherein after the calculation of the proximity effect correction dose by the correction dose calculating portion, and before a result of the calculation of the correction dose by the correction dose calculating portion is obtained, a predetermined dose of the charged particle beam is applied for drawing the patterns in a whole of the drawing area of the workpiece, wherein the proximity effect correction dose is incorporated in the predetermined dose, and the correction dose is not incorporated in the predetermined dose, and wherein after the calculation of the proximity effect correction dose by the correction dose calculating portion, and after the calculation of the correction dose by the correction dose calculating portion, a predetermined dose of the charged particle beam is applied for drawing the patterns in the whole of the drawing area of the workpiece, wherein the correction dose is incorporated in the predetermined dose, and wherein the patterns drawn after the calculation of the correction dose overlap the patterns drawn before the result of the calculation of the correction dose is obtained, and wherein shape of the patterns drawn after the calculation of the correction dose is the same as shape of the patterns drawn before the result of the calculation of the correction dose is obtained; a shot data forming portion for performing a shot dividing process and forming a shot data; and a distributor for reading a data of figures corresponding to a block frame from the drawing data corresponding to the whole of the drawing area of the workpiece, and forming a block frame unit data corresponding to the block frame, wherein the block frame unit data corresponding to the block frame is used by the pattern area density distribution calculating portion, and is used for the shot dividing process is provided.

In accordance with another aspect of the present invention, a control method of a charged particle beam drawing apparatus for drawing patterns corresponding to figures included in a drawing data, in a drawing area of a workpiece, by irradiating the workpiece with a charged particle beam, by means of multi-pass writing, wherein the workpiece is formed by applying a resist to an upper surface of the workpiece, comprising: reading a data of figures corresponding to a first block frame from the drawing data corresponding to a whole of the drawing area of the workpiece, by a first distributor, in order to form a block frame unit data corresponding to the first block frame, wherein the block frame unit data corresponding to the first block frame is used for a shot dividing process; reading a data of figures corresponding to a second block frame from the drawing data corresponding to the whole of the drawing area of the workpiece, by a second distributor, in order to form a block frame unit data corresponding to the second block frame, wherein the second block frame is larger than the first block frame, and wherein the block frame unit data corresponding to the second block frame is used by a pattern area density distribution calculating portion; performing the shot dividing process by a shot data forming portion, in order to form a shot data; calculating a first pattern area density distribution used for calculation of a proximity effect correction dose, and a second pattern area density distribution used for calculation of a fogging effect correction dose, by the pattern area density distribution calculating portion, wherein the first pattern area density distribution has a first mesh size, and wherein the second pattern area density distribution has a second mesh size, and wherein the second mesh size is different from the first mesh size; calculating the proximity effect correction dose by a proximity effect correction dose calculating portion, on the basis of the first pattern area density distribution calculated by the pattern area density distribution calculating portion; calculating the fogging effect correction dose by a fogging effect correction dose calculating portion, on the basis of the proximity effect correction dose calculated by the proximity effect correction dose calculating portion, and the second pattern area density distribution calculated by the pattern area density distribution calculating portion; applying a predetermined dose of the charged particle beam in order to draw the patterns in the whole of the drawing area of the workpiece, after the calculation of the proximity effect correction dose by the proximity effect correction dose calculating portion, and before a result of the calculation of the fogging effect correction dose by the fogging effect correction dose calculating portion is obtained, wherein the proximity effect correction dose is incorporated in the predetermined dose, and the fogging effect correction dose is not incorporated in the predetermined dose; and applying a predetermined dose of the charged particle beam in order to draw the patterns in the whole of the drawing area of the workpiece, after the calculation of the proximity effect correction dose by the proximity effect correction dose calculating portion, and after the calculation of the fogging effect correction dose by the fogging effect correction dose calculating portion, wherein the proximity effect correction dose and the fogging effect correction dose are incorporated in the predetermined dose, and wherein the patterns drawn after the calculation of the fogging effect correction dose overlap the patterns drawn before the result of the calculation of the fogging effect correction dose is obtained, and wherein shape of the patterns drawn after the calculation of the fogging effect correction dose is the same as shape of the patterns drawn before the result of the calculation of the fogging effect correction dose is obtained is provided.

Preferably, if the drawing area of the workpiece placed on a movable stage is virtually divided into N stripe frames extending in X axis direction, N being the number of the stripe frames, N being an integer which is equal to or larger than 2, and if n times pass writing is performed, n being an integer which is equal to or larger than 3, during or after an interval of intermittent movement of the movable stage in Y axis direction, the Y axis direction being perpendicular to the X axis direction, a first pass of the n times pass writing is performed by applying a predetermined dose of the charged particle beam to the N stripe frames in the whole of the drawing area of the workpiece, wherein the proximity effect correction dose is incorporated in the predetermined dose, and wherein the fogging effect correction dose is not incorporated in the predetermined dose, and then, a second pass to n times pass of the n times pass writing are performed by applying a predetermined dose of the charged particle beam to a first stripe frame of the N stripe frames, wherein the first stripe frame is placed in an end portion in the Y axis direction of the drawing area, and wherein the proximity effect correction dose and the fogging effect correction dose are incorporated in the predetermined dose, and then, the movable stage is moved in the Y axis direction, and then, the second pass to the n times pass of the n times pass writing are performed by applying the predetermined dose of the charged particle beam to a second stripe frame of the N stripe frames, wherein the second stripe frame is adjacent to the first stripe frame, and wherein the proximity effect correction dose and the fogging effect correction dose are incorporated in the predetermined dose.

Other and further objects, features and advantages of the invention will appear more fully from the following description.

BRIEF DESCRIPTION OF THE DRAWINGS

FIG. 8A explains a block frame DPB01b which is predetermined length larger than the block frame DPB01a, wherein the predetermined length corresponds to backscattering radius R1 of a charged particle, FIG. 8B explains a block frame DPB02b which is larger than the block frame DPB02a, and FIG. 8C explains a block frame DPB03b which is larger than the block frame DPB03a;

FIG. 9A explains a block frame DPB01c which is predetermined length larger than the block frame DPB01a, wherein the predetermined length corresponds to fogging radius R2 of the charged particle, FIG. 9B explains a block frame DPB02c which is larger than the block frame DPB02a, and FIG. 9C explains a block frame DPB03c which is larger than the block frame DPB03a;

FIG. 11 shows the control computer 10b1 of the charged particle beam drawing apparatus 10 of a fifth embodiment, in detail; and FIG. 12 shows the control computer 10b1 of the charged particle beam drawing apparatus 10 of a seventh embodiment, in detail.

DETAILED DESCRIPTION OF THE INVENTION

Figure 1:
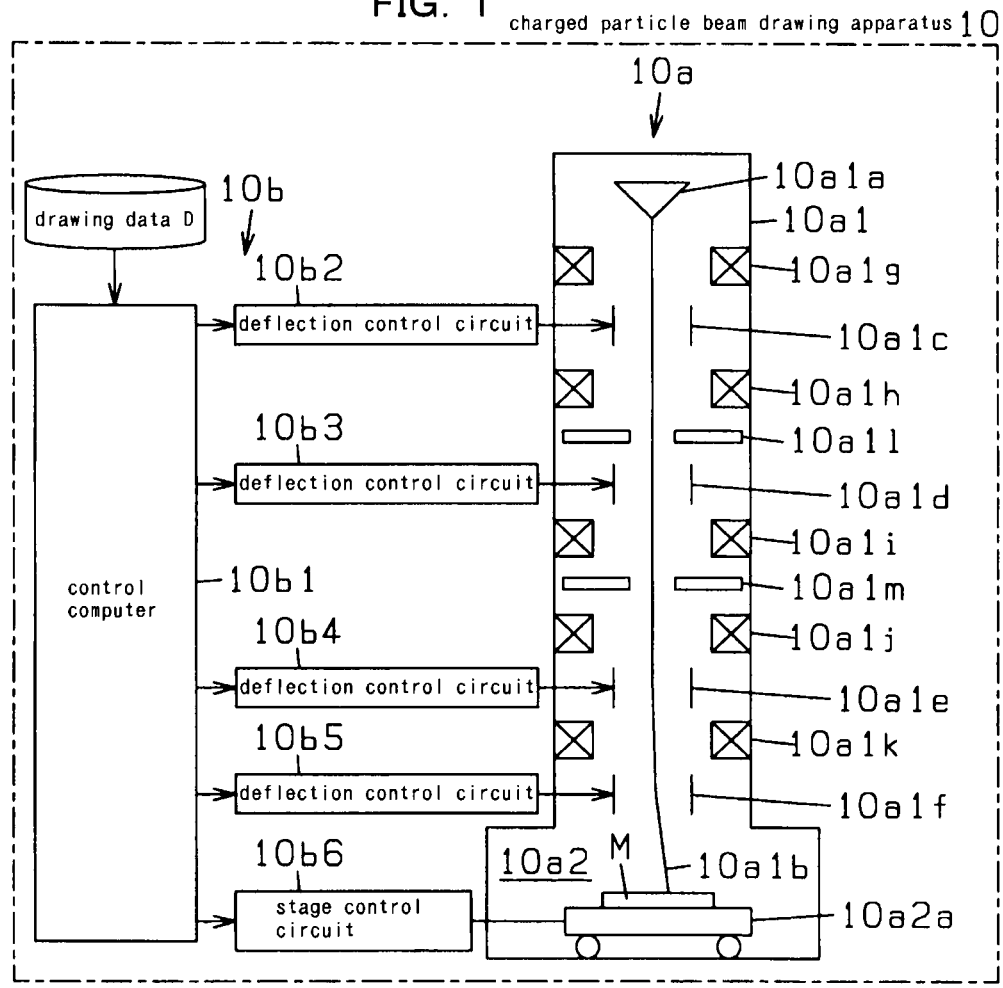
FIG. 1 is a schematic illustration of a first embodiment of a charged particle beam drawing apparatus 10 according to the present invention.
Figure 2:
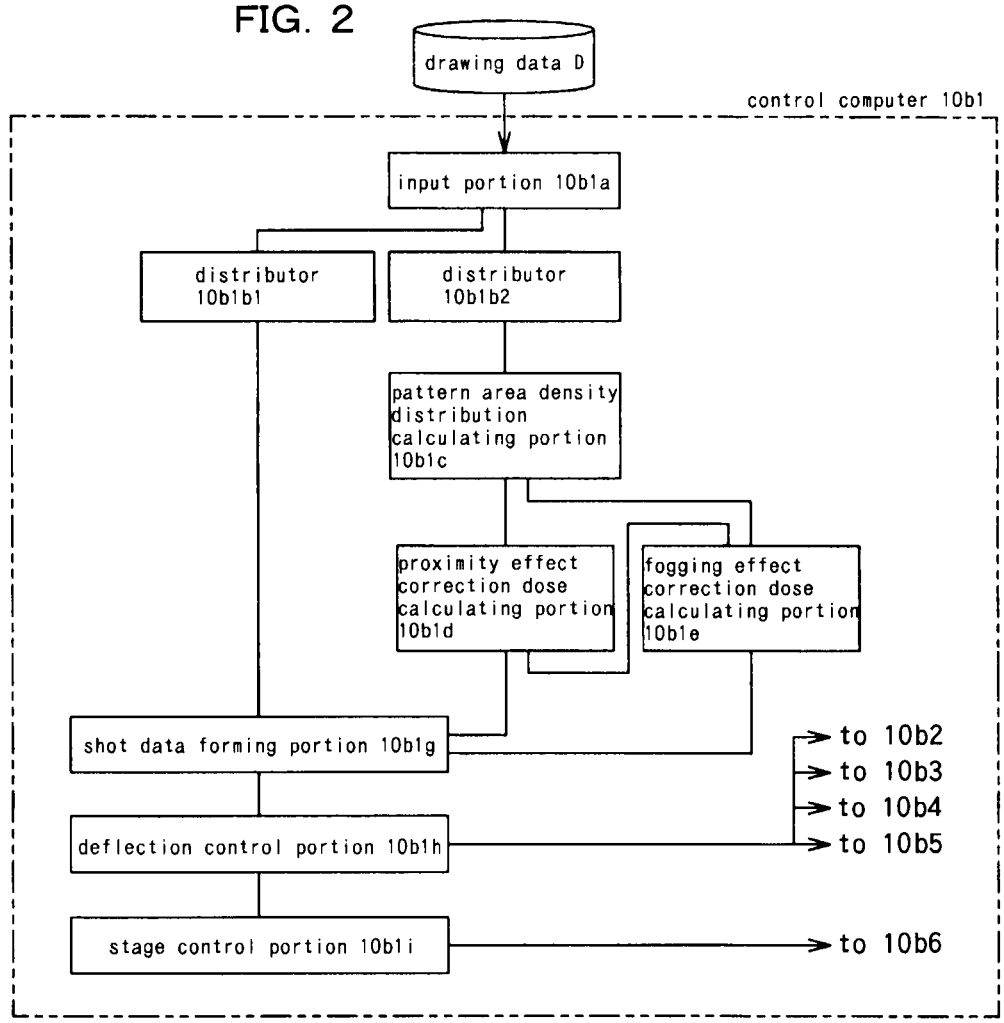
FIG. 2 shows a control computer 10b1 of a control portion 10b of the charged particle beam drawing apparatus 10 of the first embodiment shown in FIG. 1, in detail.

FIG. 1 is a schematic illustration of a first embodiment of a charged particle beam drawing apparatus 10 according to the present invention. FIG. 2 shows a control computer 10b1 of a control portion 10b of the charged particle beam drawing apparatus 10 of the first embodiment shown in FIG. 1, in detail. As shown in FIG. 1, the charged particle beam drawing apparatus 10 of the first embodiment has a drawing portion 10a for drawing patterns PA1, PA2, PA3 (see FIG. 5), etc. in a drawing area DA (see FIG. 5) of a workpiece M, such as a mask substrate (reticle) and a wafer, by irradiating the workpiece M with a charged particle beam 10a1b, wherein the workpiece M is formed by applying a resist to an upper surface of the workpiece M.

In the charged particle beam drawing apparatus 10 of the first embodiment, an electron beam is used as the charged particle beam 10a1b. In the charged particle beam drawing apparatus 10 of a second embodiment, a charged particle beam such as an ion beam, except the electron beam can be used as the charged particle beam 10a1b.

In the charged particle beam drawing apparatus 10 of the first embodiment, as shown in FIG. 1, the drawing portion 10a has a charged particle beam gun 10a1a, deflectors 10a1c, 10a1d, 10a1e, 10a1f for deflecting the charged particle beam 10a1b emitted from the charged particle beam gun 10a1a, and a movable stage 10a2a for supporting the workpiece M. Patterns are drawn on the workpiece M by the charged particle beam 10a1b deflected by the deflectors 10a1c, 10a1d, 10a1e, 10a1f.

In the charged particle beam drawing apparatus 10 of the first embodiment, as shown in FIG. 1, a drawing chamber 10a2 composes a part of the drawing portion 10a. The movable stage 10a2a for supporting the workpiece M is placed in the drawing chamber 10a2. The stage 10a2a is movable in an X axis direction (right and left direction in FIG. 5) and movable in a Y axis direction (up and down direction in FIG. 5), the Y axis direction is perpendicular to the X axis direction.

In the charged particle beam drawing apparatus 10 of the first embodiment, as shown in FIG. 1, an optical column 10a1 composes a part of the drawing portion 10a. The charged particle beam gun 10a1a, the deflectors 10a1c, 10a1d, 10a1e, 10a1f, lenses 10a1g, 10a1h, 10a1i, 10a1j, 10a1k, a first forming aperture member 10a1l and a second forming aperture member 10a1m are placed in the optical column 10a1.

In detail, in the charged particle beam drawing apparatus 10 of the first embodiment, as shown in FIGS. 1 and 2, a drawing data D corresponding to a whole of the drawing area DA (see FIG. 5) of the workpiece M is input to an input portion 10b1a of the control computer 10b1 of the control portion 10b and stored in the input portion 10b1a. And then, if proximity effect correction is not performed, and if fogging effect correction is not performed, a data of figures FG1, FG2, FG3 (see FIG. 4), etc. corresponding to a block frame DPB01a (see FIG. 6) having drawing order priority, is read from the drawing data D corresponding to the whole of the drawing area DA (see FIG. 5) of the workpiece M (see FIG. 5) and stored in the input portion 10b1a, by a distributor 10b1b1, and then, a block frame unit data corresponding to the block frame DPB01a (see FIG. 6) is formed from the drawing data D corresponding to the whole of the drawing area DA (see FIG. 5) of the workpiece M (see FIG. 5) stored in the input portion 10b1a, by the distributor 10b1b1, wherein the block frame unit data corresponding to the block frame DPB01a (see FIG. 6) has the same format as the drawing data D.

Then, in the charged particle beam drawing apparatus 10 of the first embodiment, as shown in FIG. 2, the block frame unit data corresponding to the block frame DPB01a (see FIG. 6) formed by the distributor 10b1b1, is processed by a shot data forming portion 10b1g. In detail, a shot dividing process is performed by the shot data forming portion 10b1g. Each of the figures FG1, FG2, FG3 (see FIG. 4), etc. is divided into figures by the shot dividing process. The shot dividing process is described in paragraph 0013 of Japanese Unexamined Patent Publication No. 2010-073918, in detail.

Then, in the charged particle beam drawing apparatus 10 of the first embodiment, as shown in FIG. 2, a shot data for applying a predetermined dose of the charged particle beam 10a1b (see FIG. 3) to the resist of the workpiece M (see FIGS. 5 and 6), is formed by the shot data forming portion 10b1g, in order to draw patterns the PA1, PA2, PA3 (see FIG. 5), etc. corresponding to the figures FG1, FG2, FG3 (see FIG. 4), etc. included in the drawing data D, in the block frame DPB01a (see FIG. 6) of the workpiece M (see FIGS. 5 and 6), wherein a proximity effect correction dose is not incorporated in the predetermined dose, and wherein a fogging effect correction dose is not incorporated in the predetermined dose.

Then, in the charged particle beam drawing apparatus 10 of the first embodiment, as shown in FIGS. 1 and 2, the shot data formed by the shot data forming portion 10b1g is transferred to a deflecting control portion 10b1h. Then, the deflectors 10a1c, 10a1d, 10a1e, 10a1f are controlled by the deflection control portion 10b1h on the basis of the shot data. So that, the charged particle beam 10a1b emitted from the charged particle beam gun 10a1a is applied to a predetermined position in the block frame DPB01a (see FIG. 6) of the workpiece M.

Similarly, in the charged particle beam drawing apparatus 10 of the first embodiment, as shown in FIGS. 1 and 2, if the proximity effect correction is not performed, and if the fogging effect correction is not performed, a block frame unit data corresponding to the block frame DPB02a (see FIG. 6) having the same format as the drawing data D, a block frame unit data corresponding to the block frame DPB03a (see FIG. 6) having the same format as the drawing data D, a block frame unit data corresponding to the block frame DPB04a (see FIG. 6) having the same format as the drawing data D, a block frame unit data corresponding to the block frame DPB05a (see FIG. 6) having the same format as the drawing data D, a block frame unit data corresponding to the block frame DPB06a (see FIG. 6) having the same format as the drawing data D, a block frame unit data corresponding to the block frame DPB07a (see FIG. 6) having the same format as the drawing data D, a block frame unit data corresponding to the block frame DPB08a (see FIG. 6) having the same format as the drawing data D, a block frame unit data corresponding to the block frame DPB09a (see FIG. 6) having the same format as the drawing data D, a block frame unit data corresponding to the block frame DPB10a (see FIG. 6) having the same format as the drawing data D, a block frame unit data corresponding to the block frame DPB11a (see FIG. 6) having the same format as the drawing data D, and a block frame unit data corresponding to the block frame DPB12a (see FIG. 6) having the same format as the drawing data D, are formed by the distributor 10b1b1. And then, the shot dividing process is performed by the shot data forming portion 10b1g. And then, a shot data for applying a predetermined dose of the charged particle beam 10a1b (see FIG. 3) to the resist of the workpiece M (see FIGS. 5 and 6), is formed by the shot data forming portion 10b1g, in order to draw patterns (not shown) corresponding to figures (not shown) included in the drawing data D, in the block frames DPB02a, DPB03a, DPB04a, DPB05a, DPB06a, DPB07a, DPB08a, DPB09a, DPB10a, DPB11a, DPB12a (see FIG. 6) of the workpiece M (see FIGS. 5 and 6), wherein a proximity effect correction dose is not incorporated in the predetermined dose, and wherein a fogging effect correction dose is not incorporated in the predetermined dose. And then, the deflectors 10a1c, 10a1d, 10a1e, 10a1f are controlled by the deflection control portion 10b1h on the basis of the shot data. Accordingly, the charged particle beam 10a1b emitted from the charged particle beam gun 10a1a is applied to a predetermined position in the block frames DPB02a, DPB03a, DPB04a, DPB05a, DPB06a, DPB07a, DPB08a, DPB09a, DPB10a, DPB11a, DPB12a (see FIG. 6) of the workpiece M.

In detail, in the charged particle beam drawing apparatus 10 of the first embodiment, as shown in FIGS. 1 and 2, the charged particle beam 10a1b emitted from the charged particle beam gun 10a1a is passed through an opening 10a1l' (see FIG. 3) of the first forming aperture member 10a1l and the workpiece M is irradiated with the charged particle beam 10a1b, or the charged particle beam 10a1b emitted from the charged particle beam gun 10a1a is interrupted by a part of the first forming aperture member 10a1l except the opening 10a1l' and the workpiece M is not irradiated with the charged particle beam 10a1b, by controlling a blanking deflector 10a1c via a deflection control circuit 10b2 by means of the deflection control portion 10b1h on the basis of the shot data formed by the shot data forming portion 10b1g. In other words, in the charged particle beam drawing apparatus 10 of the first embodiment, dose (beam irradiation time) of the charged particle beam 10a1b can be controlled by controlling the blanking deflector 10a1c.

In the charged particle beam drawing apparatus 10 of the first embodiment, as shown in FIGS. 1 and 2, a beam size changing deflector 10a1d is controlled via a deflection control circuit 10b3 by the deflection control portion 10b1h on the basis of the shot data formed by the shot data forming portion 10b1g, so that the charged particle beam 10a1b passed through the opening 10a1l' (see FIG. 3) of the first forming aperture member 10a1l is deflected by the beam size changing deflector 10a1d. And then, a part of the charged particle beam 10a1b deflected by the beam size changing deflector 10a1d is passed through an opening 10a1m' (see FIG. 3) of the second forming aperture member 10a1m. In other words, in the charged particle beam drawing apparatus 10 of the first embodiment, size or shape of the charged particle beam 10a1b applied to the drawing area DA (see FIG. 5) of the workpiece M can be adjusted by adjusting deflecting amount or deflecting direction of the charged particle beam 10a1b deflected by the beam size changing deflector 10a1d.

Figure 3:
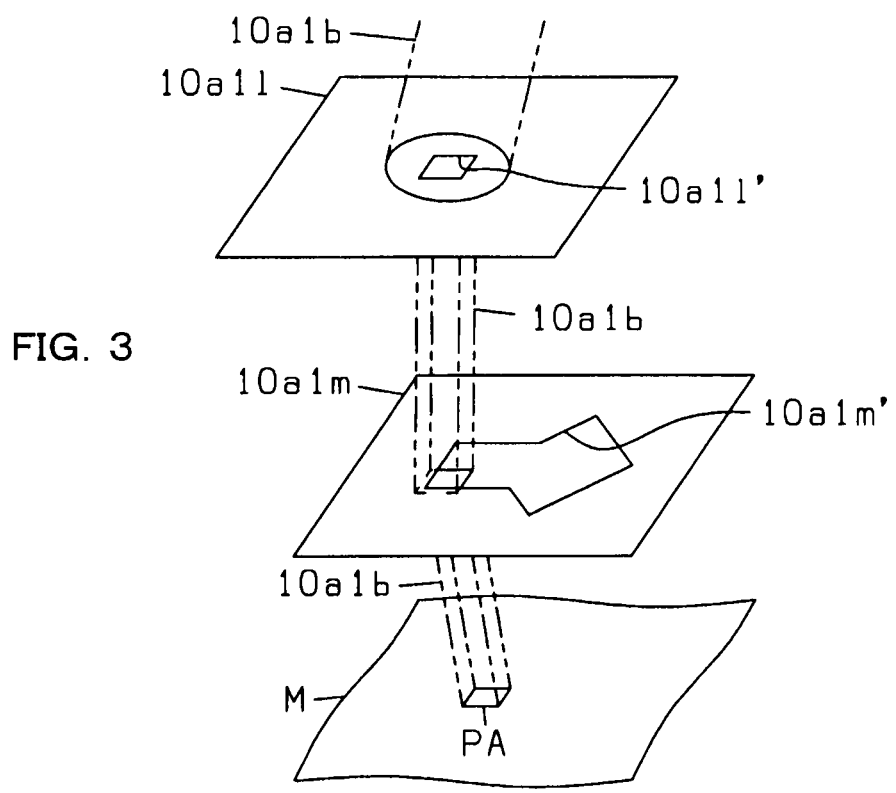
FIG. 3 shows an example of a pattern PA which can be drawn in a drawing area DA of a workpiece M by a shot of a charged particle beam 10a1b in the charged particle beam drawing apparatus 10 of the first embodiment.

FIG. 3 shows an example of a pattern PA which can be drawn in the drawing area DA of the workpiece M by a shot of the charged particle beam 10a1b in the charged particle beam drawing apparatus 10 of the first embodiment. In the charged particle beam drawing apparatus 10 of the first embodiment, as shown in FIGS. 1 and 3, when the pattern PA (see FIG. 3) is drawn on the resist of the workpiece M by the charged particle beam 10a1b, a part of the charged particle beam 10a1b emitted from the charged particle beam gun 10a1a (see FIG. 1) is passed through the square opening 10a1l' (see FIG. 3) of the first forming aperture member 10a1l. So that, a horizontal sectional shape of the charged particle beam 10a1b passed through the opening 10a1l' of the first forming aperture member 10a1l is almost square. And then, a part of the charged particle beam 10a1b passed through the opening 10a1l' of the first forming aperture member 10a1l is passed through the opening 10a1m' (see FIG. 3) of the second forming aperture member 10a1m.

In the charged particle beam drawing apparatus 10 of the first embodiment, as shown in FIGS. 1 and 3, a horizontal sectional shape of the charged particle beam 10a1b passed through the opening 10a1m' (see FIG. 3) of the second forming aperture member 10a1m can be rectangular (square or oblong) or triangular, by deflecting the charged particle beam 10a1b passed through the opening 10a1l' (see FIG. 3) of the first forming aperture member 10a1l by means of the beam size changing deflector 10a1d (see FIG. 1).

Then, in the charged particle beam drawing apparatus 10 of the first embodiment, as shown in FIGS. 1 and 3, the pattern PA (see FIG. 3) having the same shape as the horizontal sectional shape of the charged particle beam 10a1b passed through the opening 10a1m' (see FIG. 3) of the second forming aperture member 10a1m can be drawn on the resist of the workpiece M, by applying the charged particle beam 10a1b passed through the opening 10a1m' (see FIG. 3) of the second forming aperture member 10a1m, to a predetermined position on the resist of the workpiece M, for a predetermined time.

In the charged particle beam drawing apparatus 10 of the first embodiment, as shown in FIGS. 1 and 2, a deflector 10a1e is controlled via a deflection control circuit 10b4 by the deflection control portion 10b1h on the basis of the shot data formed by the shot data forming portion 10b1g, so that the charged particle beam 10a1b passed through the opening 10a1m' (see FIG. 3) of the second forming aperture member 10a1m is deflected by the deflector 10a1e.

In the charged particle beam drawing apparatus 10 of the first embodiment, as shown in FIGS. 1 and 2, a deflector 10a1f is controlled via a deflection control circuit 10b5 by the deflection control portion 10b1h on the basis of the shot data formed by the shot data forming portion 10b1g, so that the charged particle beam 10a1b deflected by the deflector 10a1e is deflected by the deflector 10a1f. Namely, in the charged particle beam drawing apparatus 10 of the first embodiment, an irradiation position of the charged particle beam 10a1b in the drawing area DA (see FIG. 5) of the workpiece M can be adjusted by adjusting deflecting amount and deflecting direction of the charged particle beam 10a1b by means of the deflector 10a1e and the deflector 10a1f.

In the charged particle beam drawing apparatus 10 of the first embodiment, as shown in FIGS. 1 and 2, movement of the movable stage 10a2a is controlled via a stage control circuit 10b6 by a stage control portion 10b1i on the basis of the shot data formed by the shot data forming portion 10b1g.

In an example shown in FIGS. 1 and 2, a CAD data (layout data, design data) prepared by a designer such as a semiconductor integrated circuit designer, is converted into the drawing data D of the format of the charged particle beam drawing apparatus 10. And then, the drawing data D is input to the control computer 10b1 of the control portion 10b of the charged particle beam drawing apparatus 10. In general, a plurality of small patterns are included in the CAD data (layout data, design data), so that the amount of the CAD data (layout data, design data) is very large. In general, after the CAD data (layout data, design data) is converted into a different format data, the amount of the data increases. Therefore, in order to compress the amount of the CAD data (layout data, design data) and the drawing data D, the CAD data (layout data, design data) and the drawing data D have hierarchical structure.

Figure 4:
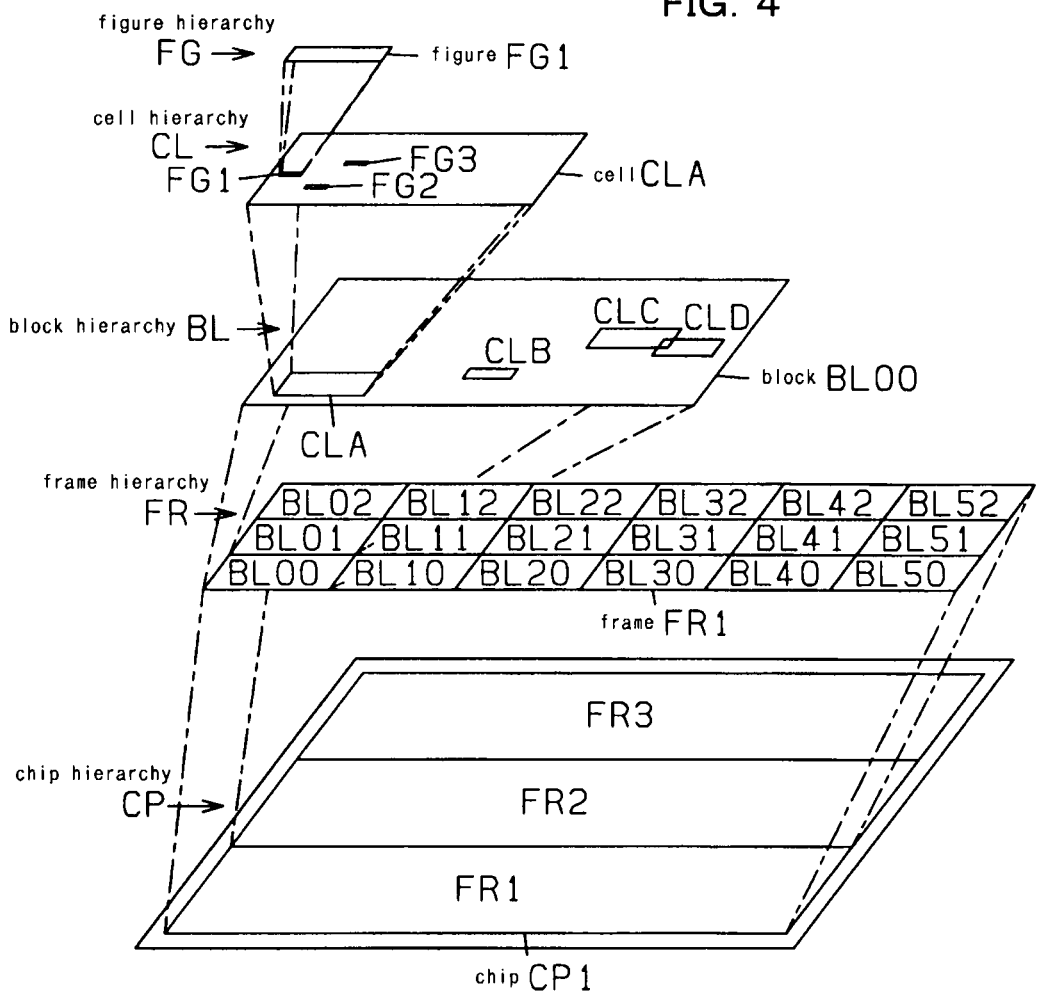
FIG. 4 shows an example of a part of a drawing data D shown in FIGS. 1 and 2.

FIG. 4 shows an example of a part of the drawing data D shown in FIGS. 1 and 2. In the example shown in FIG. 4, the drawing data D (see FIGS. 1 and 2) applied to the charged particle beam drawing apparatus 10 of the first embodiment, has a chip hierarchy CP, a frame hierarchy FR which is lower than the chip hierarchy CP, a block hierarchy BL which is lower than the frame hierarchy FR, a cell hierarchy CL which is lower than the block hierarchy BL, and a figure hierarchy FG which is lower than the cell hierarchy CL.

In the example shown in FIG. 4, a chip CP1 is one of elements of the chip hierarchy CP, and corresponds to three frames FR1, FR2, FR3. The frame FR2 is one of elements of the frame hierarchy FR, and corresponds to eighteen blocks BL00, BL10, BL20, BL30, BL40, BL50, BL01, BL11, BL21, BL31, BL41, BL51, BL02, BL12, BL22, BL32, BL42, BL52. The block BL00 is one of elements of the block hierarchy BL, and corresponds to cells CLA, CLB, CLC, CLD, etc. The cell CLA is one of elements of the cell hierarchy CL, and corresponds to a plurality of figures FG1, FG2, FG3, etc. Each of the figures FG1, FG2, FG3, etc. is one of elements of the figure hierarchy FG.

In the charged particle beam drawing apparatus 10 of the first embodiment, as shown in FIGS. 1, 2 and 4, the charged particle beam 10a1b (see FIG. 1) draws the patterns PA1, PA2, PA3 (see FIG. 5), etc. in the drawing area DA (see FIG. 5) of the workpiece M (see FIGS. 1 and 5), and the patterns PA1, PA2, PA3 (see FIG. 5), etc. correspond to the figures FG1, FG2, FG3 (see FIG. 4), etc. in the figure hierarchy FG (see FIG. 4) in the drawing data D (see FIGS. 1 and 2).

Figure 5:
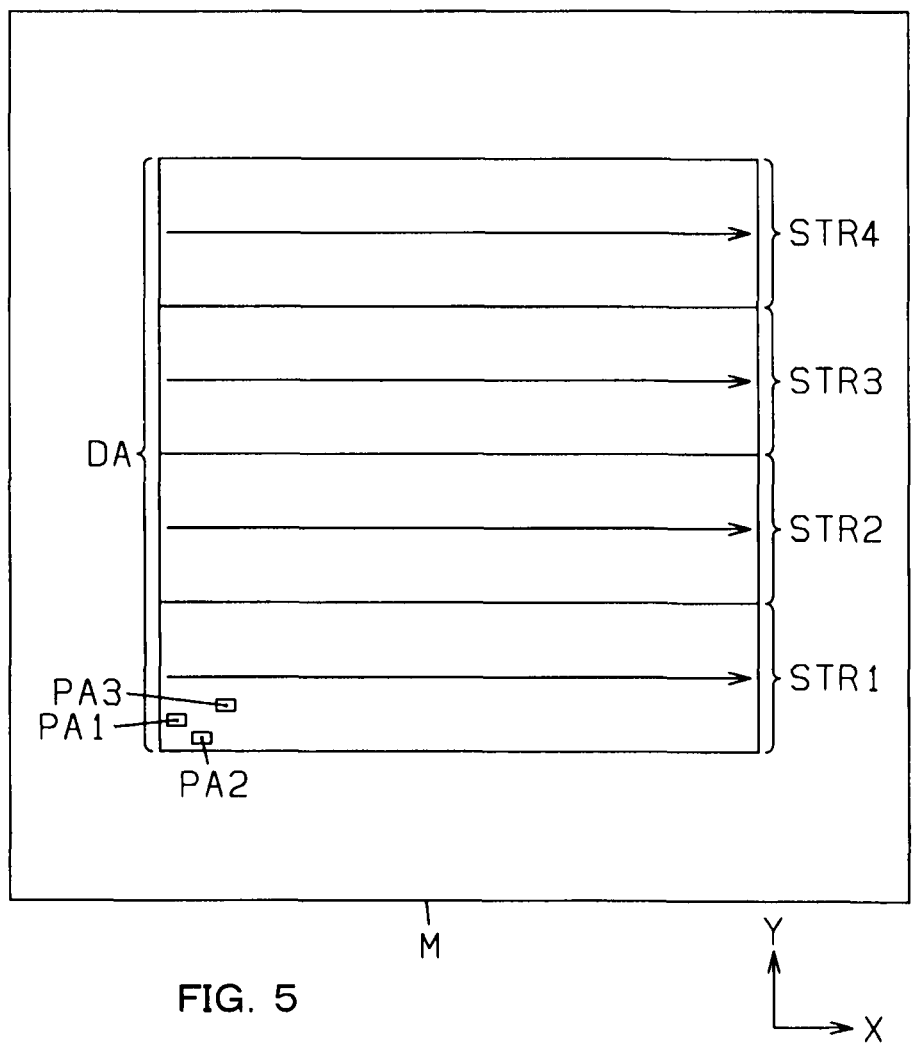
FIG. 5 shows an example of order of drawing of patterns PA1, PA2, PA3, etc. corresponding to figures FG1, FG2, FG3, etc. included in the drawing data D by means of the charged particle beam 10a1b.

FIG. 5 shows an example of order of drawing of the patterns PA1, PA2, PA3, etc. corresponding to the figures FG1, FG2, FG3, etc. included in the drawing data D by means of the charged particle beam 10a1b. In the example shown in FIG. 5, the drawing area DA of the workpiece M is virtually divided into 4 belt-shaped (rectangular) stripe frames STR1, STR2, STR3, STR4, for example, wherein each of the stripe frames STR1, STR2, STR3, STR4 extends in the X axis direction (right and left direction in FIG. 5).

In the charged particle beam drawing apparatus 10 of the first embodiment, as shown in FIG. 5, if the proximity effect correction is not performed, and if the fogging effect correction is not performed, FWD stripe drawing of the stripe frame STR1 is performed. Namely, the charged particle beam 10a1b is scanned in the stripe frame STR1 from a left side of FIG. 5 to a right side of FIG. 5. Consequently, the patterns PA1, PA2, PA3, etc. corresponding to the figures FG1, FG2, FG3 (see FIG. 4), etc. included in the drawing data D (see FIGS. 1 and 2) are drawn in the stripe frame STR1 of the workpiece M by the charged particle beam 10a1b. And then, similarly, FWD stripe drawing of the stripe frames STR2, STR3, STR4 is performed. Namely, the charged particle beam 10a1b is scanned in the stripe frames STR2, STR3, STR4 from the left side of FIG. 5 to the right side of FIG. 5. Consequently, patterns (not shown) corresponding to a plurality of figures (not shown) included in the drawing data D (see FIGS. 1 and 2) are drawn in the stripe frames STR2, STR3, STR4 of the workpiece M by the charged particle beam 10a1b.

In detail, in the example shown in FIG. 5, when the patterns PA1, PA2, PA3, etc. are drawn in the stripe frame STR1 of the workpiece M by the charged particle beam 10a1b, the movable stage 10a2a (see FIG. 1) is controlled via the stage control circuit 10b6 (see FIG. 1) by the stage control portion 10b1i (see FIG. 2), so that the movable stage 10a2a is moved from the right side of FIG. 5 to the left side of FIG. 5. Then, before the patterns (not shown) are drawn in the stripe frame STR2 of the workpiece M by the charged particle beam 10a1b, the movable stage 10a2a (see FIG. 1) is controlled via the stage control circuit 10b6 (see FIG. 1) by the stage control portion 10b1i (see FIG. 2), so that the movable stage 10a2a is moved from a left upper side of FIG. 5 to a right lower side of FIG. 5. Then, when the patterns (not shown) are drawn in the stripe frame STR2 of the workpiece M by the charged particle beam 10a1b, the movable stage 10a2a (see FIG. 1) is controlled via the stage control circuit 10b6 (see FIG. 1) by the stage control portion 10b1i (see FIG. 2), so that the movable stage 10a2a is moved from the right side of FIG. 5 to the left side of FIG. 5.

Figure 6:
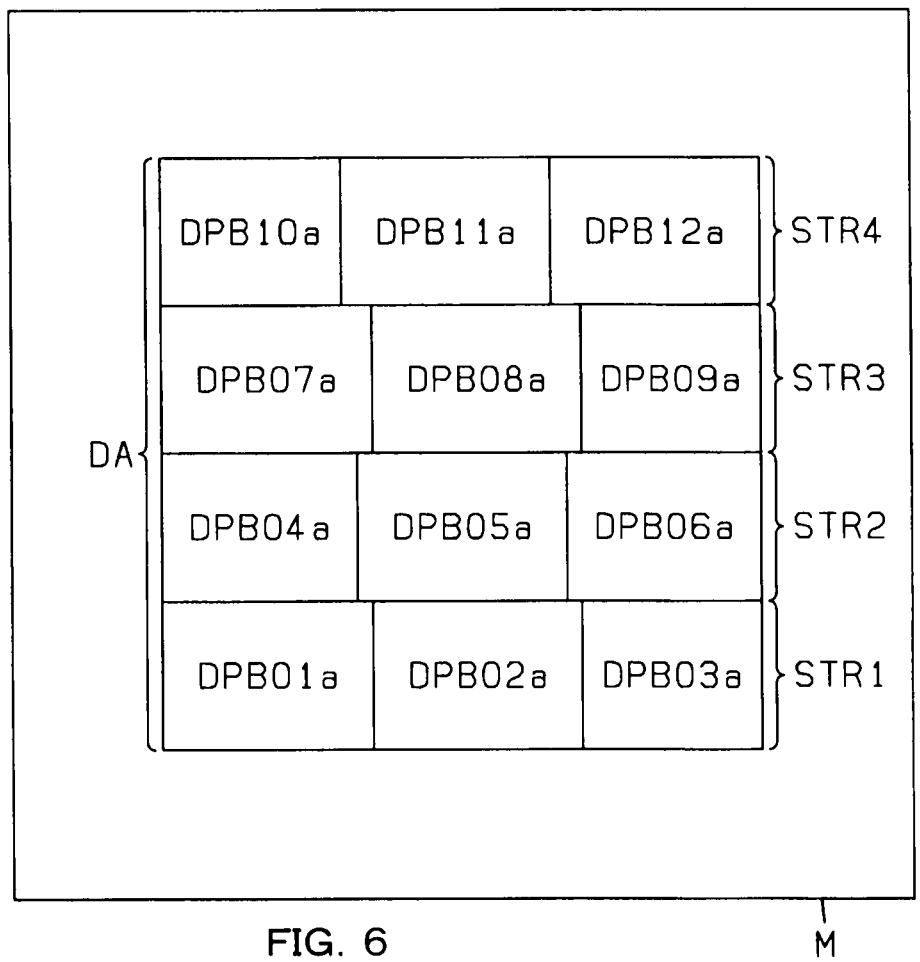
FIG. 6 shows an example of block frames DPB01a, DPB02a, DPB03a, DPB04a, DPB05a, DPB06a, DPB07a, DPB0, DPB02a, DPB03a, DPB04a, DPB05a, DPB06a, DPB07a, DPB08a, DPB09a, DPB10a, DPB11a, DPB12a formed by virtually dividing stripe frames STR1, STR2, STR3, STR4 shown in FIG. 5.

FIG. 6 shows an example of block frames DPB01a, DPB02a, DPB03a, DPB04a, DPB05a, DPB06a, DPB07a, DPB0, DPB02a, DPB03a, DPB04a, DPB05a, DPB06a, DPB07a, DPB08a, DPB09a, DPB10a, DPB11a, DPB12a formed by virtually dividing the stripe frames STR1, STR2, STR3, STR4 shown in FIG. 5. In the example shown in FIGS. 5 and 6, the stripe frame STR1 is virtually divided into three block frames DPB01a, DPB02a, DPB03a, the stripe frame STR2 is virtually divided into three block frames DPB04a, DPB05a, DPB06a, the stripe frame STR3 is virtually divided into three block frames DPB07a, DPB08a, DPB09a, and the stripe frame STR4 is virtually divided into three block frames DPB10a, DPB11a, DPB12a, for example.

The charged particle beam drawing apparatus 10 of the first embodiment can perform the drawing without performing the proximity effect correction and without performing the fogging effect correction, as mentioned above. Also, the charged particle beam drawing apparatus 10 of the first embodiment can perform the drawing while performing the proximity effect correction and/or the fogging effect correction. Before explaining the proximity effect correction and the fogging effect correction of the charged particle beam drawing apparatus 10 of the first embodiment in detail, the charged particle beam drawing apparatus in the prior art, such as the charged particle beam drawing apparatus described in Japanese Unexamined Patent Publication No. 2007-220728 is explained below, in which the proximity effect correction and the fogging effect correction are performed, while patterns are drawn on the resist in the drawing area of the workpiece.

Figure 7:
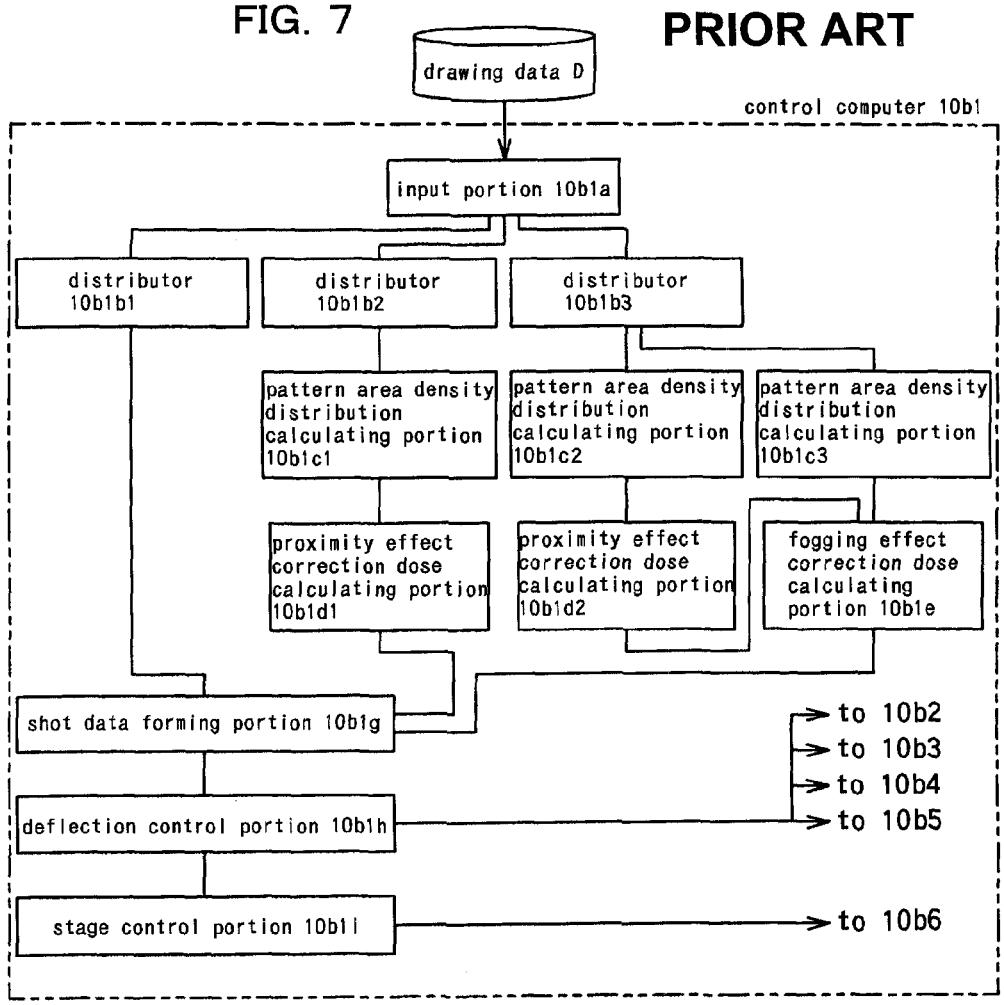
FIG. 7 shows the control computer 10b1 of a charged particle beam drawing apparatus in the prior art, such as a charged particle beam drawing apparatus described in Japanese Unexamined Patent Publication No. 2007-220728, in detail.

FIG. 7 shows the control computer 10$b$1 of the charged particle beam drawing apparatus in the prior art, such as the charged particle beam drawing apparatus described in Japanese Unexamined Patent Publication No. 2007-220728, in detail. In the charged particle beam drawing apparatus in the prior art, such as the charged particle beam drawing apparatus described in Japanese Unexamined Patent Publication No. 2007-220728, as shown in FIG. 7, the drawing data D corresponding to the whole of the drawing area DA (see FIG. 5) of the workpiece M is input to the input portion 10$b$1$a$ of the control computer 10$b$1 of the control portion 10$b$ and stored in the input portion 10$b$1$a$. And then, if the proximity effect correction and the fogging effect correction are performed, the data of the figures FG1, FG2, FG3 (see FIG. 4), etc. corresponding to the block frame DPB01$a$ (see FIG. 6) having the drawing order priority, is read from the drawing data D corresponding to the whole of the drawing area DA (see FIG. 5) of the workpiece M (see FIG. 5) by the distributor 10$b$1$b$1, and then, the block frame unit data corresponding to the block frame DPB01$a$ (see FIG. 6) is formed by the distributor 10$b$1$b$1, wherein the block frame unit data corresponding to the block frame DPB01$a$ (see FIG. 6) has the same format as the drawing data D. And then, with respect to the block frame unit data corresponding to the block frame DPB01$a$ (see FIG. 6) formed by the distributor 10$b$1$b$1, the shot dividing process is performed by the shot data forming portion 10$b$1$g$, or by a shot dividing portion (not shown) placed on an upper side of the shot data forming portion 10$b$1$g$ in FIG. 7.

In the charged particle beam drawing apparatus in the prior art, such as the charged particle beam drawing apparatus described in Japanese Unexamined Patent Publication No. 2007-220728, as shown in FIG. 7, a data of the figures FG1, FG2, FG3 (see FIG. 4), etc. corresponding to a block frame DPB01$b$ (see FIG. 8A) is read from the drawing data D corresponding to the whole of the drawing area DA (see FIG. 5) of the workpiece M (see FIG. 5) stored in the input portion 10$b$1$a$, by a distributor 10$b$1$b$2, wherein the block frame DPB01$b$ (see FIG. 8A) is predetermined length larger than the block frame DPB01$a$ (see FIG. 6), wherein the predetermined length is equal to, or is larger than a backscattering radius R1 (see FIG. 8A) of a charged particle. And then, a block frame unit data corresponding to the block frame DPB01$b$ (see FIG. 8A) is formed by the distributor 10$b$1$b$2, wherein the block frame unit data corresponding to the block frame DPB01$b$ (see FIG. 8A) has the same format as the drawing data D.

Figure 8A:
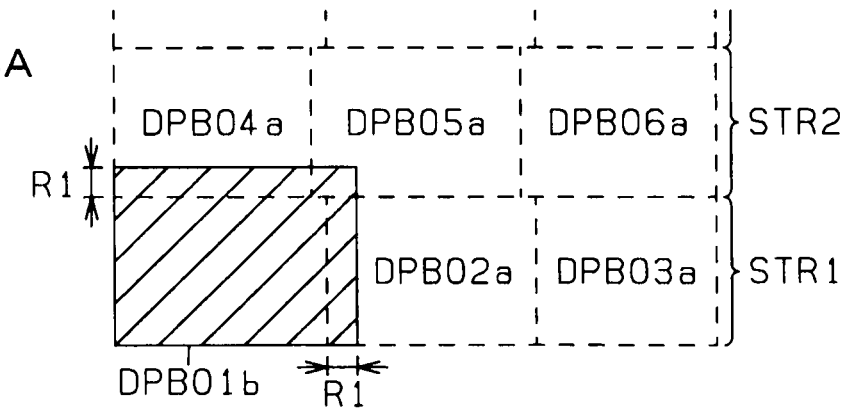
Figure 8B:
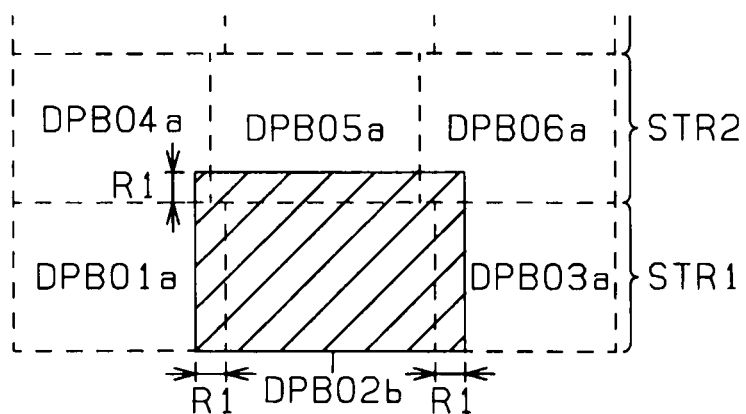
Figure 8C:
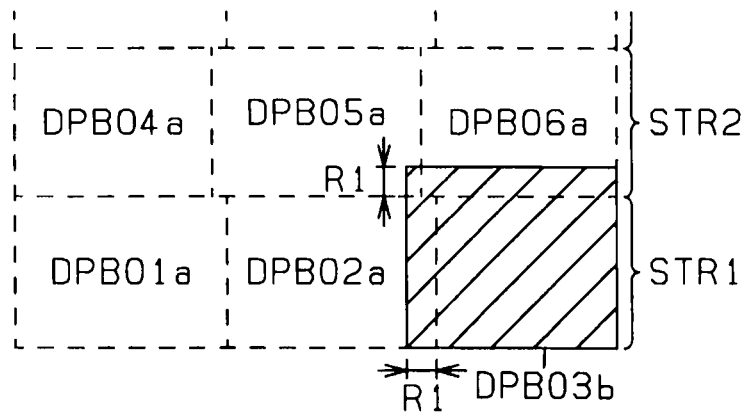

FIG. 8A explains the block frame DPB01$b$ which is the predetermined length larger than the block frame DPB01$a$ (see FIG. 6), wherein the predetermined length corresponds to the backscattering radius R1 of the charged particle. FIG. 8B explains a block frame DPB02$b$ which is larger than the block frame DPB02$a$ (see FIG. 6). FIG. 8C explains a block frame DPB03$b$ which is larger than the block frame DPB03$a$ (see FIG. 6). In detail, hatching in FIG. 8A shows the block frame DPB01$b$, hatching in FIG. 8B shows the block frame DPB02$b$, and hatching in FIG. 8C shows the block frame DPB03$b$. The backscattering radius R1 of the charged particle is described in paragraph 0003 of Japanese Unexamined Patent Publication No. 2001-189262, in detail.

Then, in the charged particle beam drawing apparatus in the prior art, such as the charged particle beam drawing apparatus described in Japanese Unexamined Patent Publication No. 2007-220728, as shown in FIG. 7, calculation of pattern area density distribution in the block frame DPB01$b$ (see FIG. 8A) is performed by a pattern area density distribution calculating portion 10$b$1$c$1, on the basis of the block frame unit data corresponding to the block frame DPB01$b$ (see FIG. 8A) formed by the distributor 10$b$1$b$2. In detail, a plurality of meshes are formed by dividing the block frame DPB01$b$ (see FIG. 8A), wherein a size of each mesh is 1 μm×1 μm. And then, the calculation of pattern area density distribution in each mesh is performed. And then, calculation of a proximity effect correction dose is performed by a proximity effect correction dose calculating portion 10$b$1$d$1, on the basis of the pattern area density distribution in the block frame DPB01$b$ (see FIG. 8A) calculated by the pattern area density distribution calculating portion 10$b$1$c$1, wherein the proximity effect correction dose is incorporated in a predetermined dose of the charged particle beam 10$a$1$b$ (see FIG. 3) applied for drawing the patterns PA1, PA2, PA3 (see FIG. 5), etc. in the block frame DPB01$a$ (see FIG. 6). The calculation of the proximity effect correction dose is described in paragraph 0064 of Japanese Unexamined Patent Publication No. 2007-220728, in detail.

In the charged particle beam drawing apparatus in the prior art, such as the charged particle beam drawing apparatus described in Japanese Unexamined Patent Publication No. 2007-220728, as shown in FIG. 7, a data of the figures FG1, FG2, FG3 (see FIG. 4), etc. corresponding to a block frame DPB01$c$ (see FIG. 9A) is read from the drawing data D corresponding to the whole of the drawing area DA (see FIG. 5) of the workpiece M (see FIG. 5) stored in the input portion 10$b$1$a$, by a distributor 10$b$1$b$3, wherein the block frame DPB01$c$ (see FIG. 9A) is predetermined length larger than the block frame DPB01$a$ (see FIG. 6), wherein the predetermined length is equal to, or is larger than a fogging radius R2 (see FIG. 9A) of the charged particle. And then, a block frame unit data corresponding to the block frame DPB01$c$ (see FIG. 9A) is formed by the distributor 10$b$1$b$3, wherein the block frame unit data corresponding to the block frame DPB01$c$ (see FIG. 9A) has the same format as the drawing data D.

FIG. 9A explains the block frame DPB01$c$ which is the predetermined length larger than the block frame DPB01$a$ (see FIG. 6), wherein the predetermined length corresponds to the fogging radius R2 of the charged particle. FIG. 9B explains a block frame DPB02$c$ which is larger than the block frame DPB02$a$ (see FIG. 6). FIG. 8C explains a block frame DPB03$c$ which is larger than the block frame DPB03$a$ (see FIG. 6). In detail, hatching in FIG. 9A shows the block frame DPB01$c$, hatching in FIG. 9B shows the block frame DPB02$c$, and hatching in FIG. 9C shows the block frame DPB03$c$. The fogging radius R2 of the charged particle is described in paragraph 0082 of Japanese Unexamined Patent Publication No. 2009-260250, in detail.

Then, in the charged particle beam drawing apparatus in the prior art, such as the charged particle beam drawing apparatus described in Japanese Unexamined Patent Publication No. 2007-220728, as shown in FIG. 7, the calculation of pattern area density distribution in the block frame DPB01$c$ (see FIG. 9A) is performed by a pattern area density distribution calculating portion 10$b$1$c$2, on the basis of the block frame unit data corresponding to the block frame DPB01$c$ (see FIG. 9A) formed by the distributor 10$b$1$b$3. In detail, a plurality of meshes are formed by dividing the block frame DPB01*c* (see FIG. 9A), wherein a size of each mesh is 5 μm×5 μm. And then, the calculation of pattern area density distribution in each mesh is performed. And then, the calculation of the proximity effect correction dose used for calculation of a fogging effect correction dose is performed by a proximity effect correction dose calculating portion 10*b*1*d*2, on the basis of the pattern area density distribution in the block frame DPB01*c* (see FIG. 9A) calculated by the pattern area density distribution calculating portion 10*b*1*c*2, wherein the fogging effect correction dose is incorporated in the predetermined dose of the charged particle beam 10*a*1*b* (see FIG. 3) applied for drawing the patterns PA1, PA2, PA3 (see FIG. 5), etc. in the block frame DPB01*a* (see FIG. 6). The calculation of the proximity effect correction dose used for the calculation of the fogging effect correction dose is described in paragraphs 0071, 0073 of Japanese Unexamined Patent Publication No. 2007-220728, in detail.

Also, in the charged particle beam drawing apparatus in the prior art, such as the charged particle beam drawing apparatus described in Japanese Unexamined Patent Publication No. 2007-220728, as shown in FIG. 7, the calculation of the pattern area density distribution in the block frame DPB01*c* (see FIG. 9A) is performed by a pattern area density distribution calculating portion 10*b*1*c*3, on the basis of the block frame unit data corresponding to the block frame DPB01*c* (see FIG. 9A) formed by the distributor 10*b*1*b*3. In detail, a plurality of meshes are formed by dividing the block frame DPB01*c* (see FIG. 9A), wherein a size of each mesh is 1 μm×1 μm. And then, the calculation of the pattern area density distribution in each mesh is performed. And then, the calculation of the fogging effect correction dose is performed by a fogging effect correction dose calculating portion 10*b*1*e*, on the basis of the proximity effect correction dose calculated by the proximity effect correction dose calculating portion 10*b*1*d*2, and the pattern area density distribution in the block frame DPB01*c* (see FIG. 9A) calculated by the pattern area density distribution calculating portion 10*b*1*c*3, wherein the fogging effect correction dose is incorporated in the predetermined dose of the charged particle beam 10*a*1*b* (see FIG. 3) applied for drawing the patterns PA1, PA2, PA3 (see FIG. 5), etc. in the block frame DPB01*a* (see FIG. 6). The calculation of the fogging effect correction dose is described in paragraphs 0077, 0081 of Japanese Unexamined Patent Publication No. 2007-220728, in detail.

Then, in the charged particle beam drawing apparatus in the prior art, such as the charged particle beam drawing apparatus described in Japanese Unexamined Patent Publication No. 2007-220728, as shown in FIG. 7, the block frame unit data corresponding to the block frame DPB01*a* (see FIG. 6) after the shot dividing process, the proximity effect correction dose calculated by the proximity effect correction dose calculating portion 10*b*1*d*1, and the fogging effect correction dose calculated by the fogging effect correction dose calculating portion 10*b*1*e* are processed by the shot data forming portion 10*b*1*g*. So that, the shot data for applying the predetermined dose of the charged particle beam 10*a*1*b* (see FIG. 3) to the resist in the block frame DPB01*a* (see FIG. 6) of the workpiece M (see FIGS. 5 and 6), is formed by the shot data forming portion 10*b*1*g*, in order to draw the patterns PA1, PA2, PA3 (see FIG. 5), etc. corresponding to the figures FG1, FG2, FG3 (see FIG. 4), etc. included in the drawing data D, in the block frame DPB01*a* (see FIG. 6) of the workpiece M (see FIGS. 5 and 6), wherein the proximity effect correction dose and the fogging effect correction dose are incorporated in the predetermined dose. In detail, the proximity effect correction dose and the fogging effect correction dose are combined and incorporated in the predetermined dose of the charged particle beam 10*a*1*b*. Combination of the proximity effect correction dose and the fogging effect correction dose is described in paragraphs 0084, 0085 of Japanese Unexamined Patent Publication No. 2007-220728, in detail.

Then, in the charged particle beam drawing apparatus in the prior art, such as the charged particle beam drawing apparatus described in Japanese Unexamined Patent Publication No. 2007-220728, as shown in FIG. 7, the shot data formed by the shot data forming portion 10*b*1*g* is transferred to the deflecting control portion 10*b*1*h*. Then, the deflectors 10*a*1*c*, 10*a*1*d*, 10*a*1*e*, 10*a*1*f* are controlled by the deflection control portion 10*b*1*h* on the basis of the shot data. So that, the charged particle beam 10*a*1*b* emitted from the charged particle beam gun 10*a*1*a* is applied to a predetermined position in the block frame DPB01*a* (see FIG. 6) of the workpiece M.

Namely, in the charged particle beam drawing apparatus in the prior art, such as the charged particle beam drawing apparatus described in Japanese Unexamined Patent Publication No. 2007-220728, the calculation of the pattern area density distribution in the block frame DPB01*c* (see FIG. 9A) is performed by means of the pattern area density distribution calculating portion 10*b*1*c*2 (see FIG. 7), by using the meshes, wherein the size of each mesh is 5 μm×5 μm. And then, the calculation of the proximity effect correction dose used for the calculation of the fogging effect correction dose and corresponding to the block frame DPB01*c* (see FIG. 9A) is performed by the proximity effect correction dose calculating portion 10*b*1*d*2 (see FIG. 7).

Accordingly, the charged particle beam drawing apparatus in the prior art can have higher accuracy of the fogging effect correction dose than a case in which it is assumed that the proximity effect correction dose used for the calculation of the fogging effect correction dose and corresponding to the block frame DPB01*c* (see FIG. 9A) is constant. Namely, the charged particle beam drawing apparatus in the prior art can decrease an error caused by a mutual relation between the proximity effect correction and the fogging effect correction than the case. The case in which it is assumed that the proximity effect correction dose used for the calculation of the fogging effect correction dose and corresponding to the block frame DPB01*c* (see FIG. 9A) is constant, is described in paragraph 0032 of Japanese Unexamined Patent Publication No. 2007-220728, in detail.

In the charged particle beam drawing apparatus in the prior art, such as the charged particle beam drawing apparatus described in Japanese Unexamined Patent Publication No. 2007-220728, it is intended that the calculation concerning the proximity effect correction and the fogging effect correction is performed while the patterns PA1, PA2, PA3 (see FIG. 5), etc. are drawn on the resist in the drawing area DA (see FIG. 5) of the workpiece M (see FIG. 5). However, in the charged particle beam drawing apparatus in the prior art, such as the charged particle beam drawing apparatus described in Japanese Unexamined Patent Publication No. 2007-220728, before the drawing of the patterns PA1, PA2, PA3 (see FIG. 5), etc. included in the block frame DPB01*a* (see FIG. 6) is started, it is required to complete the shot dividing process corresponding to the block frame DPB01*a* (see FIG. 6), and the calculation corresponding to the block frame DPB01*b* (see FIG. 8A) performed by the pattern area density distribution calculating portion 10*b*1*c*1 (see FIG. 7) and the proximity effect correction dose calculating portion 10*b*1*d*1 (see FIG. 7), wherein the block frame DPB01*b* (see FIG. 8A) is slightly larger than the block frame DPB01*a* (see FIG. 6). Also, in the charged particle beam drawing apparatus in the prior art, such as the charged particle beam drawing apparatus described in Japanese Unexamined Patent Publication No.

2007-220728, before the drawing of the patterns PA1, PA2, PA3 (see FIG. 5), etc. included in the block frame DPB01a (see FIG. 6) is started, it is required to complete the calculation corresponding to the block frame DPB01c (see FIG. 9A) performed by the pattern area density distribution calculating portion 10b1c2 (see FIG. 7), the proximity effect correction dose calculating portion 10b1d2 (see FIG. 7), the pattern area density distribution calculating portion 10b1c3 (see FIG. 7) and the fogging effect correction dose calculating portion 10b1e (see FIG. 7), wherein the block frame DPB01c (see FIG. 9A) is fairly larger than the block frame DPB01a (see FIG. 6).

Therefore, in the charged particle beam drawing apparatus in the prior art, such as the charged particle beam drawing apparatus described in Japanese Unexamined Patent Publication No. 2007-220728, actually, the drawing of the patterns PA1, PA2, PA3 (see FIG. 5), etc. included in the block frame DPB01a (see FIG. 6) cannot be immediately started.

Particularly, in the charged particle beam drawing apparatus in the prior art, such as the charged particle beam drawing apparatus described in Japanese Unexamined Patent Publication No. 2007-220728, the calculation corresponding to the block frame DPB01c (see FIG. 9A) performed by the pattern area density distribution calculating portion 10b1c2 (see FIG. 7) and the proximity effect correction dose calculating portion 10b1d2 (see FIG. 7) are supplemented in order to improve the accuracy of the fogging effect correction dose. Therefore, in the charged particle beam drawing apparatus in the prior art, such as the charged particle beam drawing apparatus described in Japanese Unexamined Patent Publication No. 2007-220728, waiting time before the drawing of the patterns PA1, PA2, PA3 (see FIG. 5), etc. included in the block frame DPB01a (see FIG. 6) is started, is increased.

Also, as mentioned above, the block frame DPB01c (see FIG. 9A) is fairly larger than the block frame DPB01a (see FIG. 6). And, as mentioned above, in the charged particle beam drawing apparatus in the prior art, such as the charged particle beam drawing apparatus described in Japanese Unexamined Patent Publication No. 2007-220728, before the drawing of the patterns PA1, PA2, PA3 (see FIG. 5), etc. included in the block frame DPB01a (see FIG. 6) is started, it is required to complete the calculation corresponding to the block frame DPB01c (see FIG. 9A) performed by the pattern area density distribution calculating portion 10b1c3 (see FIG. 7) and the fogging effect correction dose calculating portion 10b1e (see FIG. 7). Therefore, in the charged particle beam drawing apparatus in the prior art, such as the charged particle beam drawing apparatus described in Japanese Unexamined Patent Publication No. 2007-220728, the waiting time is increased.

Consequently, the charged particle beam drawing apparatus 10 of the first embodiment includes a following improvement. Concretely, in the charged particle beam drawing apparatus 10 of the first embodiment, multi-pass writing is performed. The multi-pass writing is described in Japanese Unexamined Patent Publication No. H10-261557, in detail. FIGS. 10A, 10B, 10C and 10D shows an example of order of stripe drawing #01, stripe drawing #02, stripe drawing #03, stripe drawing #04, stripe drawing #05, stripe drawing #06, stripe drawing #07, stripe drawing #08, stripe drawing #09, stripe drawing #10, stripe drawing #11, and stripe drawing #12, wherein multi-pass writing, for example 4 pass writing, is performed by the charged particle beam drawing apparatus 10 of the first embodiment.

Figure 10A:
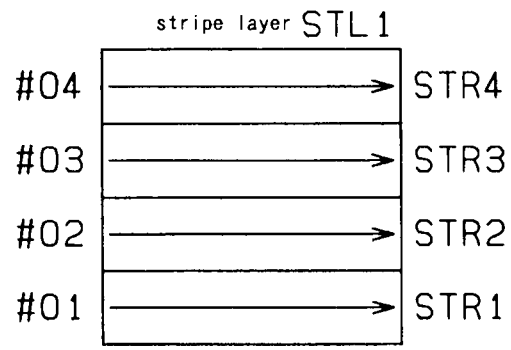
FIGS. 10A, 10B, 10C and 10D shows an example of order of stripe drawing #01, stripe drawing #02, stripe drawing #03, stripe drawing #04, stripe drawing #05, stripe drawing #06, stripe drawing #07, stripe drawing #08, stripe drawing #09, stripe drawing #10, stripe drawing #11, and stripe drawing #12, wherein in this example, 4 pass writing is performed by the charged particle beam drawing apparatus 10 of the first embodiment.

In the charged particle beam drawing apparatus 10 of the first embodiment, if 4 pass writing is performed, a predetermined dose of the charged particle beam 10a1b (see FIG. 3) is applied by a first pass of the 4 pass writing, wherein a proximity effect correction dose calculated by a proximity effect correction dose calculating portion 10b1d (see FIG. 2) is incorporated in the predetermined dose, and wherein a fogging effect correction dose calculated by a fogging effect correction dose calculating portion 10b1e (see FIG. 2) is not incorporated in the predetermined dose, and wherein the first pass of the 4 pass writing corresponds to drawing of a stripe layer STL1 (see FIG. 10A). Accordingly, the patterns PA1, PA2, PA3 (see FIG. 5), etc. corresponding to the figures FG1, FG2, FG3 (see FIG. 4), etc. included in the drawing data D (see FIG. 2) are drawn on the resist in the whole of the drawing area DA (see FIG. 5) of the workpiece M (see FIG. 5) by the first pass of the 4 pass writing.

In detail, in the charged particle beam drawing apparatus 10 of the first embodiment, as shown in FIG. 2, if the proximity effect correction is performed, and if the fogging effect correction is performed, the drawing data D corresponding to the whole of the drawing area DA (see FIG. 5) of the workpiece M is input to the input portion 10b1a of the control computer 10b1 of the control portion 10b and stored in the input portion 10b1a. And then, the data of the figures FG1, FG2, FG3 (see FIG. 4), etc. corresponding to the block frame DPB01a (see FIG. 6) having the drawing order priority, is read from the drawing data D corresponding to the whole of the drawing area DA (see FIG. 5) of the workpiece M (see FIG. 5) and stored in the input portion 10b1a, by the distributor 10b1b1, and then, the block frame unit data corresponding to the block frame DPB01a (see FIG. 6) is formed from the drawing data D corresponding to the whole of the drawing area DA (see FIG. 5) of the workpiece M (see FIG. 5) stored in the input portion 10b1a, by the distributor 10b1b1, wherein the block frame unit data corresponding to the block frame DPB01a (see FIG. 6) has the same format as the drawing data D. And then, the shot dividing process is performed by the shot data forming portion 10b1g, with respect to the block frame unit data corresponding to the block frame DPB01a (see FIG. 6) formed by the distributor 10b1b1.

Also, in the charged particle beam drawing apparatus 10 of the first embodiment, as shown in FIG. 2, the data of the figures FG1, FG2, FG3 (see FIG. 4), etc. corresponding to the block frame DPB01b (see FIG. 8A) is read from the drawing data D corresponding to the whole of the drawing area DA (see FIG. 5) of the workpiece M (see FIG. 5) stored in the input portion 10b1a, by the distributor 10b1b2, wherein the block frame DPB01b (see FIG. 8A) is the predetermined length larger than the block frame DPB01a (see FIG. 6), wherein the predetermined length is equal to, or is larger than the backscattering radius R1 (see FIG. 8A) of the charged particle. And then, the block frame unit data corresponding to the block frame DPB01b (see FIG. 8A) is formed by the distributor 10b1b2, wherein the block frame unit data corresponding to the block frame DPB01b (see FIG. 8A) has the same format as the drawing data D.

Then, in the charged particle beam drawing apparatus 10 of the first embodiment, as shown in FIG. 2, the calculation of the pattern area density distribution in the block frame DPB01b (see FIG. 8A) is performed by a pattern area density distribution calculating portion 10b1c, on the basis of the block frame unit data corresponding to the block frame DPB01b (see FIG. 8A) formed by the distributor 10b1b2. In detail, a plurality of meshes are formed by dividing the block frame DPB01b (see FIG. 8A), wherein a size of each mesh is 1 µm×1 µm, for example. And then, the calculation of the pattern area density distribution in each mesh is performed. And then, the calculation of the proximity effect correction dose is performed by the proximity effect correction dose calculating portion 10*b*1*d*, on the basis of the pattern area density distribution in the block frame DPB01*b* (see FIG. 8A) calculated by the pattern area density distribution calculating portion 10*b*1*c*, wherein the proximity effect correction dose is incorporated in the predetermined dose of the charged particle beam 10*a*1*b* (see FIG. 3) applied for drawing the patterns PA1, PA2, PA3 (see FIG. 5), etc. in the block frame DPB01*a* (see FIG. 6).

Then, in the charged particle beam drawing apparatus 10 of the first embodiment, as shown in FIG. 2, the block frame unit data corresponding to the block frame DPB01*a* (see FIG. 6) after the shot dividing process performed by the shot data forming portion 10*b*1*g*, and the proximity effect correction dose calculated by the proximity effect correction dose calculating portion 10*b*1*d* are processed by the shot data forming portion 10*b*1*g*. So that, the shot data for applying the predetermined dose of the charged particle beam 10*a*1*b* (see FIG. 3) to the resist in the block frame DPB01*a* (see FIG. 6) of the workpiece M (see FIGS. 5 and 6), is formed by the shot data forming portion 10*b*1*g*, in order to draw the patterns PA1, PA2, PA3 (see FIG. 5), etc. corresponding to the figures FG1, FG2, FG3 (see FIG. 4), etc. included in the drawing data D, in the block frame DPB01*a* (see FIG. 6) of the workpiece M (see FIGS. 5 and 6), wherein the proximity effect correction dose is incorporated in the predetermined dose, and wherein the fogging effect correction dose is not incorporated in the predetermined dose.

Then, in the charged particle beam drawing apparatus 10 of the first embodiment, as shown in FIG. 2, the shot data formed by the shot data forming portion 10*b*1*g* is transferred to the deflecting control portion 10*b*1*h*. Then, the deflectors 10*a*1*c*, 10*a*1*d*, 10*a*1*e*, 10*a*1*f* (see FIG. 1) are controlled by the deflection control portion 10*b*1*h* on the basis of the shot data. So that, the charged particle beam 10*a*1*b* (see FIG. 3) emitted from the charged particle beam gun 10*a*1*a* (see FIG. 1) is applied to the predetermined position in the block frame DPB01*a* (see FIG. 6) of the workpiece M (see FIG. 5).

Similarly, in the charged particle beam drawing apparatus 10 of the first embodiment, as shown in FIG. 2, the shot dividing process is performed by the shot data forming portion 10*b*1*g*, with respect to the block frame unit data corresponding to the block frames DPB02*a*, DPB03*a* (see FIG. 6) formed by the distributor 10*b*1*b*1. Also, the calculation of the proximity effect correction dose is performed by the proximity effect correction dose calculating portion 10*b*1*d*, wherein the proximity effect correction dose is incorporated in the predetermined dose of the charged particle beam 10*a*1*b* (see FIG. 3) applied for drawing the patterns (not shown) in the block frames DPB02*a*, DPB03*a* (see FIG. 6). And then, the shot data for applying the predetermined dose of the charged particle beam 10*a*1*b* (see FIG. 3) to the resist in the block frames DPB02*a*, DPB03*a* (see FIG. 6) of the workpiece M (see FIGS. 5 and 6), is formed by the shot data forming portion 10*b*1*g*, in order to draw the patterns (not shown) corresponding to the figures (not shown) included in the drawing data D, in the block frames DPB02*a*, DPB03*a* (see FIG. 6) of the workpiece M (see FIGS. 5 and 6), wherein the proximity effect correction dose is incorporated in the predetermined dose, and wherein the fogging effect correction dose is not incorporated in the predetermined dose. And then, the deflectors 10*a*1*c*, 10*a*1*d*, 10*a*1*e*, 10*a*1*f* (see FIG. 1) are controlled by the deflection control portion 10*b*1*h* on the basis of the shot data. So that, the charged particle beam 10*a*1*b* (see FIG. 3) emitted from the charged particle beam gun 10*a*1*a* (see FIG. 1) is applied to the predetermined position in the block frames DPB02*a*, DPB03*a* (see FIG. 6) of the workpiece M (see FIG. 5). Namely, the charged particle beam 10*a*1*b* (see FIG. 3) is scanned in the stripe frame STR1 (see FIG. 10A) from a left side of FIG. 10A to a right side of FIG. 10A, so that a first stripe drawing #01 (see FIG. 10A) is performed by the FWD stripe drawing. And then, the movable stage 10*a*2*a* (see FIG. 1) is moved in the Y axis direction (up and down direction in FIG. 5). In detail, the movable stage 10*a*2*a* (see FIG. 1) is moved from the left upper side of FIG. 5 to the right lower side of FIG. 5.

Then, in the charged particle beam drawing apparatus 10 of the first embodiment, similarly, the shot data for applying the predetermined dose of the charged particle beam 10*a*1*b* (see FIG. 3) to the resist in the block frames DPB04*a*, DPB05*a*, DPB06*a* (see FIG. 6) of the workpiece M (see FIGS. 5 and 6), is formed by the shot data forming portion 10*b*1*g* (see FIG. 2), in order to draw the patterns (not shown) corresponding to the figures (not shown) included in the drawing data D (see FIG. 2), in the block frames DPB04*a*, DPB05*a*, DPB06*a* (see FIG. 6) of the workpiece M (see FIGS. 5 and 6), wherein the proximity effect correction dose is incorporated in the predetermined dose, and wherein the fogging effect correction dose is not incorporated in the predetermined dose. And then, the charged particle beam 10*a*1*b* (see FIG. 3) emitted from the charged particle beam gun 10*a*1*a* (see FIG. 1) is applied to the predetermined position in the block frames DPB04*a*, DPB05*a*, DPB06*a* (see FIG. 6) of the workpiece M (see FIG. 5). Namely, the charged particle beam 10*a*1*b* (see FIG. 3) is scanned in the stripe frame STR2 (see FIG. 10A) from the left side of FIG. 10A to the right side of FIG. 10A, so that a second stripe drawing #02 (see FIG. 10A) is performed by the FWD stripe drawing. And then, the movable stage 10*a*2*a* (see FIG. 1) is moved in the Y axis direction (up and down direction in FIG. 5). In detail, the movable stage 10*a*2*a* (see FIG. 1) is moved from the left upper side of FIG. 5 to the right lower side of FIG. 5.

Then, in the charged particle beam drawing apparatus 10 of the first embodiment, similarly, the shot data for applying the predetermined dose of the charged particle beam 10*a*1*b* (see FIG. 3) to the resist in the block frames DPB07*a*, DPB08*a*, DPB09*a* (see FIG. 6) of the workpiece M (see FIGS. 5 and 6), is formed by the shot data forming portion 10*b*1*g* (see FIG. 2), in order to draw the patterns (not shown) corresponding to the figures (not shown) included in the drawing data D (see FIG. 2), in the block frames DPB07*a*, DPB08*a*, DPB09*a* (see FIG. 6) of the workpiece M (see FIGS. 5 and 6), wherein the proximity effect correction dose is incorporated in the predetermined dose, and wherein the fogging effect correction dose is not incorporated in the predetermined dose. And then, the charged particle beam 10*a*1*b* (see FIG. 3) emitted from the charged particle beam gun 10*a*1*a* (see FIG. 1) is applied to the predetermined position in the block frames DPB07*a*, DPB08*a*, DPB09*a* (see FIG. 6) of the workpiece M (see FIG. 5). Namely, the charged particle beam 10*a*1*b* (see FIG. 3) is scanned in the stripe frame STR3 (see FIG. 10A) from the left side of FIG. 10A to the right side of FIG. 10A, so that a third stripe drawing #03 (see FIG. 10A) is performed by the FWD stripe drawing. And then, the movable stage 10*a*2*a* (see FIG. 1) is moved in the Y axis direction (up and down direction in FIG. 5). In detail, the movable stage 10*a*2*a* (see FIG. 1) is moved from the left upper side of FIG. 5 to the right lower side of FIG. 5.

Then, in the charged particle beam drawing apparatus 10 of the first embodiment, similarly, the shot data for applying the predetermined dose of the charged particle beam 10*a*1*b* (see FIG. 3) to the resist in the block frames DPB10*a*, DPB11*a*, DPB12*a* (see FIG. 6) of the workpiece M (see FIGS. 5 and 6), is formed by the shot data forming portion 10*b*1*g* (see FIG. 2), in order to draw the patterns (not shown) corresponding to the figures (not shown) included in the drawing data D (see FIG. 2), in the block frames DPB10a, DPB11a, DPB12a (see FIG. 6) of the workpiece M (see FIGS. 5 and 6), wherein the proximity effect correction dose is incorporated in the predetermined dose, and wherein the fogging effect correction dose is not incorporated in the predetermined dose. And then, the charged particle beam 10a1b (see FIG. 3) emitted from the charged particle beam gun 10a1a (see FIG. 1) is applied to the predetermined position in the block frames DPB10a, DPB11a, DPB12a (see FIG. 6) of the workpiece M (see FIG. 5). Namely, the charged particle beam 10a1b (see FIG. 3) is scanned in the stripe frame STR4 (see FIG. 10A) from the left side of FIG. 10A to the right side of FIG. 10A, so that a fourth stripe drawing #04 (see FIG. 10A) is performed by the FWD stripe drawing.

Namely, in the charged particle beam drawing apparatus 10 of the first embodiment, the predetermined dose of the charged particle beam 10a1b (see FIG. 3) is applied, wherein the proximity effect correction dose is incorporated in the predetermined dose, and wherein the fogging effect correction dose is not incorporated in the predetermined dose. So that, the first pass of the 4 pass writing is performed with respect to the whole of the drawing area DA (see FIG. 5) of the workpiece M (see FIG. 5), wherein the first pass of the 4 pass writing corresponds to the drawing of the stripe layer STL1 (see FIG. 10A).

As mentioned above, in the charged particle beam drawing apparatus in the prior art, such as the charged particle beam drawing apparatus described in Japanese Unexamined Patent Publication No. 2007-220728, before the drawing of the patterns PA1, PA2, PA3 (see FIG. 5), etc. included in the block frame DPB01a (see FIG. 6) is started, it is required to complete the calculation corresponding to the block frame DPB01c (see FIG. 9A) performed by the pattern area density distribution calculating portion 10b1c2 (see FIG. 7), the proximity effect correction dose calculating portion 10b1d2 (see FIG. 7), the pattern area density distribution calculating portion 10b1c3 (see FIG. 7) and the fogging effect correction dose calculating portion 10b1e (see FIG. 7), wherein the block frame DPB01c (see FIG. 9A) is fairly larger than the block frame DPB01a (see FIG. 6). Therefore, in the charged particle beam drawing apparatus in the prior art, such as the charged particle beam drawing apparatus described in Japanese Unexamined Patent Publication No. 2007-220728, the drawing of the patterns PA1, PA2, PA3 (see FIG. 5), etc. included in the block frame DPB01a (see FIG. 6) cannot be immediately started.

Whereas, in the charged particle beam drawing apparatus 10 of the first embodiment, before the drawing of the patterns PA1, PA2, PA3 (see FIG. 5), etc. included in the block frame DPB01a (see FIG. 6) is started, it is not necessary to complete the calculation corresponding to the block frame DPB01c (see FIG. 9A) performed by the pattern area density distribution calculating portion 10b1c (see FIG. 2) and the fogging effect correction dose calculating portion 10b1e (see FIG. 2), wherein the block frame DPB01c (see FIG. 9A) is fairly larger than the block frame DPB01a (see FIG. 6). Accordingly, the charged particle beam drawing apparatus 10 of the first embodiment can start the drawing of the patterns PA1, PA2, PA3 (see FIG. 5), etc. included in the block frame DPB01a (see FIG. 6) earlier than the charged particle beam drawing apparatus in the prior art, such as the charged particle beam drawing apparatus described in Japanese Unexamined Patent Publication No. 2007-220728.

Also, in the charged particle beam drawing apparatus 10 of the first embodiment, as shown in FIG. 2, the block frame unit data corresponding to the block frames DPB01b, DPB02b, DPB03b (see FIGS. 8A, 8B and 8C), etc. formed by the distributor 10b1b2, is used for the calculation of the proximity effect correction dose and used for the calculation of the fogging effect correction dose, wherein the block frame unit data corresponding to the block frames DPB01b, DPB02b, DPB03b (see FIGS. 8A, 8B and 8C), etc. has the same format as the drawing data D. Concretely, while the drawing of the first pass of the 4 pass writing corresponding to the drawing of the stripe layer STL1 (see FIG. 10A) is performed, the calculation of the pattern area density distribution used for the calculation of the fogging effect correction dose is started by the pattern area density distribution calculating portion 10b1c, on the basis of the block frame unit data corresponding to the block frames DPB01b, DPB02b, DPB03b (see FIGS. 8A, 8B and 8C), etc. formed by the distributor 10b1b2. Otherwise, after the drawing of the first pass of the 4 pass writing corresponding to the drawing of the stripe layer STL1 (see FIG. 10A) is performed, the calculation of the pattern area density distribution used for the calculation of the fogging effect correction dose is started by the pattern area density distribution calculating portion 10b1c, on the basis of the block frame unit data corresponding to the block frames DPB01b, DPB02b, DPB03b (see FIGS. 8A, 8B and 8C), etc. formed by the distributor 10b1b2.

In detail, in the charged particle beam drawing apparatus 10 of the first embodiment, as shown in FIG. 2, a plurality of meshes are formed by dividing the block frames DPB01b, DPB02b, DPB03b (see FIGS. 8A, 8B and 8C), etc., wherein a size of each mesh is 10 μm×10 μm, for example. And then, the calculation of the pattern area density distribution in each mesh is performed. And then, the calculation of the fogging effect correction dose is performed by the fogging effect correction dose calculating portion 10b1e, on the basis of the pattern area density distribution in the block frames DPB01b, DPB02b, DPB03b (see FIG. 9A), etc. calculated by the pattern area density distribution calculating portion 10b1c, wherein the fogging effect correction dose is incorporated in the predetermined dose of the charged particle beam 10a1b (see FIG. 3) applied for drawing the patterns PA1, PA2, PA3 (see FIG. 5), etc. in the block frames DPB01a to DPB12a (see FIG. 6).

In detail, in an example shown in FIGS. 6, 8A, 8B, 8C, 9A, 9B and 9C, after approximately half of the block frame unit data corresponding to the block frames DPB01b, DPB02b, DPB03b (see FIGS. 8A, 8B and 8C), etc. in the drawing area DA (see FIG. 5) is formed by the distributor 10b1b2 (see FIG. 2), the calculation of the pattern area density distribution in the block frames DPB01b, DPB02b, DPB03b (see FIGS. 8A, 8B and 8C) can be started by the pattern area density distribution calculating portion 10b1c (see FIG. 2), wherein the pattern area density distribution in the block frames DPB01b, DPB02b, DPB03b (see FIGS. 8A, 8B and 8C), etc. is necessary for the calculation of the fogging effect correction dose, and wherein the fogging effect correction dose is incorporated in the predetermined dose of the charged particle beam 10a1b (see FIG. 3) applied for drawing the patterns PA1, PA2, PA3 (see FIG. 5), etc. in the block frames DPB01a, DPB02a, DPB03a (see FIG. 6). And, in an example shown in FIGS. 6, 8A, 8B, 8C, 9A, 9B and 9C, after all of the block frame unit data corresponding to the block frames DPB01b, DPB02b, DPB03b (see FIGS. 8A, 8B and 8C), etc. in the whole of the drawing area DA (see FIG. 5) is formed by the distributor 10b1b2 (see FIG. 2), the calculation of the pattern area density distribution in the whole of the drawing area DA (see FIG. 5) can be started by the pattern area density distribution calculating portion 10b1c (see FIG. 2), wherein the pattern area density distribution in the whole of the drawing area DA (see FIG. 5) is necessary for the calculation of the fogging effect correction dose, and wherein the fogging effect correction dose is incorporated in the predetermined dose of the charged particle beam $10a1b$ (see FIG. 3) applied for drawing all of the patterns PA1, PA2, PA3 (see FIG. 5), etc. in the whole of the drawing area DA (see FIG. 5).

Then, in the charged particle beam drawing apparatus 10 of the first embodiment, as shown in FIG. 2, the block frame unit data corresponding to the block frames DPB01$a$ to DPB12$a$ (see FIG. 6) after the shot dividing process by the shot data forming portion $10b1g$, the proximity effect correction dose calculated by the proximity effect correction dose calculating portion $10b1d$, and the fogging effect correction dose calculated by the fogging effect correction dose calculating portion $10b1e$ are processed by the shot data forming portion $10b1g$. So that, the shot data for applying the predetermined dose of the charged particle beam $10a1b$ (see FIG. 3) to the resist in the block frames DPB01$a$ to DPB12$a$ (see FIG. 6) of the workpiece M (see FIGS. 5 and 6), is formed by the shot data forming portion $10b1g$, in order to draw the patterns PA1, PA2, PA3 (see FIG. 5), etc. corresponding to the figures FG1, FG2, FG3 (see FIG. 4), etc. included in the drawing data D, in the block frames DPB01$a$ to DPB12$a$ (see FIG. 6) of the workpiece M (see FIGS. 5 and 6), wherein the proximity effect correction dose and the fogging effect correction dose are incorporated in the predetermined dose.

Figure 10B:
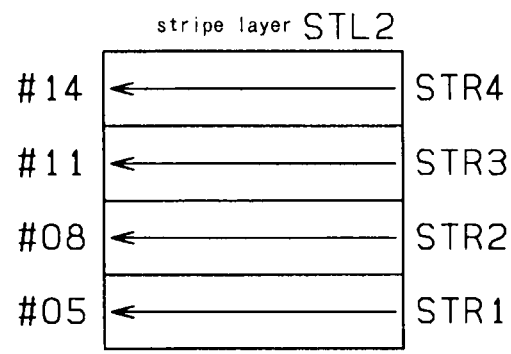
Figure 10C:
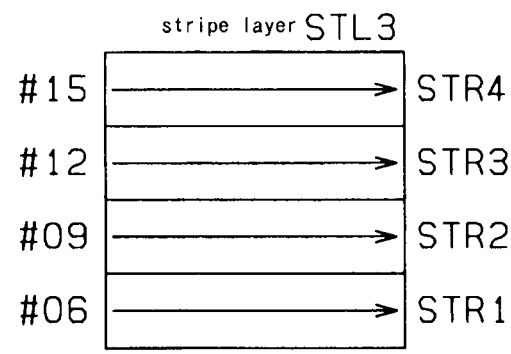
Figure 10D:
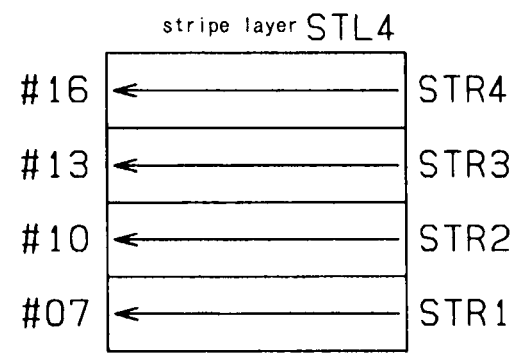

In detail, in the charged particle beam drawing apparatus 10 of the first embodiment, the predetermined dose of the charged particle beam $10a1b$ (see FIG. 3) is applied by a second pass, a third pass and a fourth pass of the 4 pass writing, wherein the proximity effect correction dose calculated by the proximity effect correction dose calculating portion $10b1d$ (see FIG. 2) is incorporated in the predetermined dose, and wherein the fogging effect correction dose calculated by the fogging effect correction dose calculating portion $10b1e$ (see FIG. 2) is incorporated in the predetermined dose, and wherein the second pass of the 4 pass writing corresponds to drawing of a stripe layer STL2 (see FIG. 10B), the third pass of the 4 pass writing corresponds to drawing of a stripe layer STL3 (see FIG. 10C), and the fourth pass of the 4 pass writing corresponds to drawing of a stripe layer STL4 (see FIG. 10D). Accordingly, the patterns PA1, PA2, PA3 (see FIG. 5), etc. are drawn by the second pass, the third pass and the fourth pass of the 4 pass writing, on the patterns PA1, PA2, PA3 (see FIG. 5), etc. in the whole of the drawing area DA (see FIG. 5) of the workpiece M (see FIG. 5) drawn by the first pass of the 4 pass writing, wherein the patterns PA1, PA2, PA3 (see FIG. 5), etc. drawn by the second pass, the third pass and the fourth pass of the 4 pass writing overlap the patterns PA1, PA2, PA3 (see FIG. 5), etc. drawn by the first pass of the 4 pass writing, and wherein shape of the patterns PA1, PA2, PA3 (see FIG. 5), etc. drawn by the second pass, the third pass and the fourth pass of the 4 pass writing is the same as shape of the patterns PA1, PA2, PA3 (see FIG. 5), etc. drawn by the first pass of the 4 pass writing.

Namely, in the charged particle beam drawing apparatus 10 of the first embodiment, if the 4 pass writing is performed, when the first pass of the 4 pass writing corresponding to the drawing of the stripe layer STL1 (see FIG. 10A) is performed, the predetermined dose of the charged particle beam $10a1b$ (see FIG. 3) is applied by the first pass of the 4 pass writing, wherein the proximity effect correction dose calculated by the proximity effect correction dose calculating portion $10b1d$ (see FIG. 2) is incorporated in the predetermined dose, and wherein the fogging effect correction dose calculated by the fogging effect correction dose calculating portion $10b1e$ (see FIG. 2) is not incorporated in the predetermined dose, and then, when the second pass of the 4 pass writing corresponding to the drawing of the stripe layer STL2 (see FIG. 10B), the third pass of the 4 pass writing corresponding to the drawing of the stripe layer STL3 (see FIG. 10C), and the fourth pass of the 4 pass writing corresponding to the drawing of the stripe layer STL4 (see FIG. 10D) are performed, the predetermined dose of the charged particle beam $10a1b$ (see FIG. 3) is applied by the second pass, the third pass, and the fourth pass of the 4 pass writing, wherein the proximity effect correction dose calculated by the proximity effect correction dose calculating portion $10b1d$ (see FIG. 2) is incorporated in the predetermined dose, and wherein the fogging effect correction dose calculated by the fogging effect correction dose calculating portion $10b1e$ (see FIG. 2) is incorporated in the predetermined dose. In detail, the predetermined dose of the charged particle beam $10a1b$ (see FIG. 3) applied by the first pass of the 4 pass writing, the predetermined dose of the charged particle beam $10a1b$ (see FIG. 3) applied by the second pass of the 4 pass writing, the predetermined dose of the charged particle beam $10a1b$ (see FIG. 3) applied by the third pass of the 4 pass writing, and the predetermined dose of the charged particle beam $10a1b$ (see FIG. 3) applied by the fourth pass of the 4 pass writing are respectively determined, so that sum of the predetermined dose of the charged particle beam $10a1b$ (see FIG. 3) applied by the first pass of the 4 pass writing, the predetermined dose of the charged particle beam $10a1b$ (see FIG. 3) applied by the second pass of the 4 pass writing, the predetermined dose of the charged particle beam $10a1b$ (see FIG. 3) applied by the third pass of the 4 pass writing, and the predetermined dose of the charged particle beam $10a1b$ (see FIG. 3) applied by the fourth pass of the 4 pass writing is equal to a required dose of the charged particle beam $10a1b$ (see FIG. 3) applied for precisely drawing the patterns PA1, PA2, PA3 (see FIG. 5), etc., wherein the proximity effect correction dose and the fogging effect correction dose are incorporated in the required dose.

In other words, in the charged particle beam drawing apparatus in the prior art, such as the charged particle beam drawing apparatus described in Japanese Unexamined Patent Publication No. 2007-220728, the distributor $10b1b2$ (see FIG. 7) for forming the block frame unit data corresponding to the block frame DPB01$b$ (see FIG. 8A), used by the pattern area density distribution calculating portion $10b1c1$ (see FIG. 7), and used for the proximity effect correction, and the distributor $10b1b3$ (see FIG. 7) for forming the block frame unit data corresponding to the block frame DPB01$c$ (see FIG. 9A), used by the pattern area density distribution calculating portions $10b1c2$, $10b1c3$ (see FIG. 7), and used for the fogging effect correction are respectively provided.

Whereas, in the charged particle beam drawing apparatus 10 of the first embodiment, the block frame unit data corresponding to the block frame DPB01$b$ (see FIG. 8A) formed by the distributor $10b1b2$ (see FIG. 2) is used by the pattern area density distribution calculating portion $10b1c$ (see FIG. 2) in order to calculate the pattern area density distribution for the proximity effect correction, and to calculate the pattern area density distribution for the fogging effect correction. Accordingly, the charged particle beam drawing apparatus 10 of the first embodiment can decrease a whole of processing load of the distributors $10b1b1$, $10b1b2$ (see FIG. 2), and can decrease transfer time of the drawing data D (see FIG. 2) from the input portion $10b1a$ (see FIG. 2) to the distributors $10b1b1$, $10b1b2$ (see FIG. 2) than the charged particle beam drawing apparatus in the prior art, such as the charged particle beam drawing apparatus described in Japanese Unexamined Patent Publication No. 2007-220728, in which the distributor 10*b*1*b*2 (see FIG. 7) and the distributor 10*b*1*b*3 (see FIG. 7) are respectively provided.

In the charged particle beam drawing apparatus in the prior art, such as the charged particle beam drawing apparatus described in Japanese Unexamined Patent Publication No. 2007-220728, the pattern area density distribution calculating portions 10*b*1*c*2 (see FIG. 7) and the proximity effect correction dose calculating portion 10*b*1*d*2 (see FIG. 7) are provided for the calculation of the proximity effect correction dose used for the fogging effect correction, in addition to the pattern area density distribution calculating portions 10*b*1*c*1 (see FIG. 7) and the proximity effect correction dose calculating portion 10*b*1*d*1 (see FIG. 7) for the calculation of the proximity effect correction dose, and the pattern area density distribution calculating portions 10*b*1*c*3 (see FIG. 7) and the fogging effect correction dose calculating portion 10*b*1*e* (see FIG. 7) for the calculation of the fogging effect correction dose.

Whereas, in the charged particle beam drawing apparatus 10 of the first embodiment, the proximity effect correction dose calculated by the pattern area density distribution calculating portions 10*b*1*c* (see FIG. 2) and the proximity effect correction dose calculating portion 10*b*1*d* (see FIG. 2), is used for the proximity effect correction, and is used for the fogging effect correction. Accordingly, the charged particle beam drawing apparatus 10 of the first embodiment can decrease a whole of processing load of the proximity effect correction and the fogging effect correction than the charged particle beam drawing apparatus in the prior art, such as the charged particle beam drawing apparatus described in Japanese Unexamined Patent Publication No. 2007-220728, in which the pattern area density distribution calculating portions 10*b*1*c*2 (see FIG. 7) and the proximity effect correction dose calculating portion 10*b*1*d*2 (see FIG. 7) are provided for the calculation of the proximity effect correction dose used for the fogging effect correction.

In the charged particle beam drawing apparatus 10 of the first embodiment, the pattern area density distribution calculating portion 10*b*1*c* (see FIG. 2) performs the calculation of the pattern area density distribution used for the proximity effect correction by using the plurality of meshes, wherein the size of each mesh is 1 μm×1 μm, for example, and the pattern area density distribution calculating portion 10*b*1*c* (see FIG. 2) performs the calculation of the pattern area density distribution used for the fogging effect correction by using the plurality of meshes, wherein the size of each mesh is 10 μm×10 μm, for example. Accordingly, the charged particle beam drawing apparatus 10 of the first embodiment can decrease the whole of the processing load of the proximity effect correction and the fogging effect correction than a case, in which a pattern area density distribution calculating portion for calculating pattern area density distribution used for the proximity effect correction and a pattern area density distribution calculating portion for calculating pattern area density distribution used for the fogging effect correction are respectively provided.

In the charged particle beam drawing apparatus 10 of the first embodiment, as shown in FIG. 10A, during or after an interval of intermittent movement of the movable stage 10*a*2*a* (see FIG. 1) in the Y axis direction (up and down direction in FIG. 5), the first pass of the 4 pass writing corresponding to the drawing of the stripe layer STL1 (see FIG. 10A) is performed by applying the predetermined dose of the charged particle beam 10*a*1*b* (see FIG. 3) to the 4 belt-shaped (rectangular) stripe frames STR1, STR2, STR3, STR4 in the whole of the drawing area DA (see FIG. 5) of the workpiece M (see FIG. 5), wherein the proximity effect correction dose is incorporated in the predetermined dose, and wherein the fogging effect correction dose is not incorporated in the predetermined dose.

Then, in the charged particle beam drawing apparatus 10 of the first embodiment, as shown in FIG. 10B, the second pass of the 4 pass writing corresponding to the drawing of the stripe layer STL2 (see FIG. 10B) is performed by applying the predetermined dose of the charged particle beam 10*a*1*b* (see FIG. 3) to the stripe frame STR1, for example, wherein the proximity effect correction dose and the fogging effect correction dose are incorporated in the predetermined dose, and wherein the stripe frame STR1 is placed in a lower end portion of the drawing area DA (see FIG. 5) including the stripe frames STR1, STR2, STR3, STR4, for example. In detail, as shown in FIG. 10B, a fifth stripe drawing #05 is performed by BWD stripe drawing, wherein the charged particle beam 10*a*1*b* is scanned in the stripe frame STR1 from a right side of FIG. 10B to a left side of FIG. 10B.

Then, in the charged particle beam drawing apparatus 10 of the first embodiment, as shown in FIG. 10C, the third pass of the 4 pass writing corresponding to the drawing of the stripe layer STL3 (see FIG. 10O) is performed by applying the predetermined dose of the charged particle beam 10*a*1*b* (see FIG. 3) to the stripe frame STR1, wherein the proximity effect correction dose and the fogging effect correction dose are incorporated in the predetermined dose. In detail, as shown in FIG. 10C, a sixth stripe drawing #06 is performed by the FWD stripe drawing, wherein the charged particle beam 10*a*1*b* is scanned in the stripe frame STR1 from a left side of FIG. 10O to a right side of FIG. 10O.

Then, in the charged particle beam drawing apparatus 10 of the first embodiment, as shown in FIG. 10D, the fourth pass of the 4 pass writing corresponding to the drawing of the stripe layer STL4 (see FIG. 10D) is performed by applying the predetermined dose of the charged particle beam 10*a*1*b* (see FIG. 3) to the stripe frame STR1, wherein the proximity effect correction dose and the fogging effect correction dose are incorporated in the predetermined dose. In detail, as shown in FIG. 10D, a seventh stripe drawing #07 is performed by the BWD stripe drawing, wherein the charged particle beam 10*a*1*b* is scanned in the stripe frame STR1 from a right side of FIG. 10D to a left side of FIG. 10D. And then, the movable stage 10*a*2*a* (see FIG. 1) is moved to a lower side of FIG. 5.

Then, in the charged particle beam drawing apparatus 10 of the first embodiment, as shown in FIGS. 10B, 10C and 10D, similarly, the second pass, the third pass and the fourth pass of the 4 pass writing corresponding to the drawing of the stripe layers STL2, STL3, STL4 (see FIGS. 10B, 10C and 10D) are performed by applying the predetermined dose of the charged particle beam 10*a*1*b* (see FIG. 3) to the stripe frame STR2 which is adjacent to the stripe frame STR1, wherein the proximity effect correction dose and the fogging effect correction dose are incorporated in the predetermined dose. In detail, as shown in FIGS. 10B, 10C and 10D, an eighth stripe drawing #08, a ninth stripe drawing #09 and a 10th stripe drawing #10 are performed. And then, the movable stage 10*a*2*a* (see FIG. 1) is moved to the lower side of FIG. 5.

Then, in the charged particle beam drawing apparatus 10 of the first embodiment, as shown in FIGS. 10B, 10C and 10D, similarly, the second pass, the third pass and the fourth pass of the 4 pass writing corresponding to the drawing of the stripe layers STL2, STL3, STL4 (see FIGS. 10B, 10C and 10D) are performed by applying the predetermined dose of the charged particle beam 10*a*1*b* (see FIG. 3) to the stripe frame STR3 which is adjacent to the stripe frame STR2, wherein the proximity effect correction dose and the fogging effect correction dose are incorporated in the predetermined dose. In detail, as shown in FIGS. 10B, 10C and 10D, an 11th stripe drawing #11, a 12th stripe drawing #12 and a 13th stripe drawing #13 are performed. And then, the movable stage 10$a$2$a$ (see FIG. 1) is moved to the lower side of FIG. 5.

Then, in the charged particle beam drawing apparatus 10 of the first embodiment, as shown in FIGS. 10B, 10C and 10D, similarly, the second pass, the third pass and the fourth pass of the 4 pass writing corresponding to the drawing of the stripe layers STL2, STL3, STL4 (see FIGS. 10B, 10C and 10D) are performed by applying the predetermined dose of the charged particle beam 10$a$1$b$ (see FIG. 3) to the stripe frame STR4 which is adjacent to the stripe frame STR3, wherein the proximity effect correction dose and the fogging effect correction dose are incorporated in the predetermined dose. In detail, as shown in FIGS. 10B, 10C and 10D, a 14th stripe drawing #14, a 15th stripe drawing #15 and a 16th stripe drawing #16 are performed.

Namely, in the charged particle beam drawing apparatus 10 of the first embodiment, as shown in FIGS. 10B, 10C and 10D, the movable stage 10$a$2$a$ (see FIG. 1) is not moved in the Y axis direction (up and down direction in FIG. 5) during an interval between the second pass of the 4 pass writing corresponding to the fifth stripe drawing #05 and the third pass of the 4 pass writing corresponding to the sixth stripe drawing #06. And, the movable stage 10$a$2$a$ (see FIG. 1) is not moved in the Y axis direction (up and down direction in FIG. 5) during an interval between the third pass of the 4 pass writing corresponding to the sixth stripe drawing #06 and the fourth pass of the 4 pass writing corresponding to the seventh stripe drawing #07. Accordingly, the charged particle beam drawing apparatus 10 of the first embodiment can improve a throughput than a case, in which the movable stage 10$a$2$a$ (see FIG. 1) is moved in the Y axis direction (up and down direction in FIG. 5) during the interval between the second pass of the 4 pass writing corresponding to the fifth stripe drawing #05 and the third pass of the 4 pass writing corresponding to the sixth stripe drawing #06, and during the interval between the third pass of the 4 pass writing corresponding to the sixth stripe drawing #06 and the fourth pass of the 4 pass writing corresponding to the seventh stripe drawing #07.

Namely, in the charged particle beam drawing apparatus 10 of the first embodiment, as shown in FIGS. 10B, 10C and 10D, the fifth stripe drawing #05 is performed by the BWD stripe drawing, and then the sixth stripe drawing #06 is performed by the FWD stripe drawing, and then the seventh stripe drawing #07 is performed by the BWD stripe drawing. Namely, the FWD stripe drawing and the BWD stripe drawing are alternately performed. Accordingly, an amount of movement of the movable stage 10$a$2$a$ (see FIG. 1) in the X axis direction (right and left direction in FIG. 5) during the interval between the fifth stripe drawing #05 and the sixth stripe drawing #06 and during the interval between the sixth stripe drawing #06 and the seventh stripe drawing #07, can be decreased, and the throughput can be increased than a case in which the FWD stripe drawing is continuously performed, or than a case in which the BWD stripe drawing is continuously performed.

Inventors of the present invention discovered through their diligent research that, finish condition of the patterns PA1, PA2, PA3 (see FIG. 5), etc. drawn in the stripe frame STR1 (see FIG. 5) in a case shown in FIGS. 10A, 10B, 10C and 10D in which the FWD stripe drawing is performed twice and the BWD stripe drawing is performed twice in order to perform the 4 pass writing in the stripe frame STR1 (see FIG. 5), finish condition of the patterns PA1, PA2, PA3 (see FIG. 5), etc. drawn in the stripe frame STR1 (see FIG. 5) in a case (not shown) in which the FWD stripe drawing is performed 4 times and the BWD stripe drawing is not performed in order to perform the 4 pass writing in the stripe frame STR1 (see FIG. 5), and finish condition of the patterns PA1, PA2, PA3 (see FIG. 5), etc. drawn in the stripe frame STR1 (see FIG. 5) in a case (not shown) in which the FWD stripe drawing is not performed and the BWD stripe drawing is performed 4 times in order to perform the 4 pass writing in the stripe frame STR1 (see FIG. 5), are different.

Consequently, in the charged particle beam drawing apparatus 10 of the first embodiment, as shown in FIGS. 10B, 10C and 10D, the number of times of the FWD stripe drawing which is a part of the 4 pass writing, is equal to the number of times of the BWD stripe drawing which is the other part of the 4 pass writing, in all of the stripe frames STR1, STR2, STR3, STR4 in the drawing area DA (see FIG. 5) of the workpiece M (see FIG. 5), wherein the number of times of the FWD stripe drawing is 2, and the number of times of the BWD stripe drawing is 2 in an example shown in FIGS. 10A, 10B, 10C and 10D. Accordingly, the charged particle beam drawing apparatus 10 of the first embodiment can decrease dispersion among the stripe frames STR1, STR2, STR3, STR4.

In the charged particle beam drawing apparatus 10 of the first embodiment, the size of each mesh of the pattern area density distribution used for the calculation of the proximity effect correction dose is smaller than the size of each mesh of the pattern area density distribution used for the calculation of the fogging effect correction dose, wherein the size of each mesh of the pattern area density distribution used for the calculation of the proximity effect correction dose is 1 µm×1 µm, and the size of each mesh of the pattern area density distribution used for the calculation of the fogging effect correction dose is 10 µm×10 µm, for example. Whereas, in a variation of the charged particle beam drawing apparatus 10 of the first embodiment, the size of each mesh of the pattern area density distribution used for the calculation of the proximity effect correction dose can be larger than the size of each mesh of the pattern area density distribution used for the calculation of the fogging effect correction dose, wherein the size of each mesh of the pattern area density distribution used for the calculation of the proximity effect correction dose is 1 µm×1 µm, and the size of each mesh of the pattern area density distribution used for the calculation of the fogging effect correction dose is 0.1 µm×0.1 µm, for example.

In the charged particle beam drawing apparatus 10 of the first embodiment, the fogging effect correction is not performed in the first pass of the multi-pass writing corresponds to the drawing of the stripe layer STL1 (see FIG. 10A), and the fogging effect correction is performed in others of the multi-pass writing corresponds to the drawing of the stripe layers STL2, STL3, STL4 (see FIGS. 10B, 10C and 10D). Whereas, in the charged particle beam drawing apparatus 10 of a third embodiment, the fogging effect correction is performed in a last pass of the multi-pass writing corresponds to the drawing of the stripe layer STL4 (see FIG. 10D), and the fogging effect correction is not performed in others of the multi-pass writing corresponds to the drawing of the stripe layers STL1, STL2, STL3 (see FIGS. 10A, 10B and 10C).

In the charged particle beam drawing apparatus 10 of the first embodiment, the part of the multi-pass writing is composed by the FWD stripe drawing corresponding to the drawing of the stripe layers STL1, STL3 (see FIGS. 10A and 10C), and the other part of the multi-pass writing is composed by the BWD stripe drawing corresponding to the drawing of the stripe layers STL2, STL4 (see FIGS. 10B and 10D). Whereas, in the charged particle beam drawing apparatus 10 of a fourth embodiment, all of the multi-pass writing is composed by the FWD stripe drawing, or all of the multi-pass writing is composed by the BWD stripe drawing.

FIG. 11 shows the control computer 10b1 of the charged particle beam drawing apparatus 10 of a fifth embodiment, in detail. In the charged particle beam drawing apparatus 10 of the first embodiment, the proximity effect correction is performed in the first pass of the multi-pass writing corresponds to the drawing of the stripe layer STL1 (see FIG. 10A). Whereas, in the charged particle beam drawing apparatus 10 of the fifth embodiment, the proximity effect correction is not performed in the first pass of the multi-pass writing corresponds to the drawing of the stripe layer STL1 (see FIG. 10A). Accordingly, in the charged particle beam drawing apparatus 10 of the fifth embodiment, the distributor 10b1b2 (see FIG. 2) for forming the block frame unit data corresponding to the block frame DPB01b (see FIG. 8A) which is larger than the block frame DPB01a (see FIG. 6), is not necessary.

Namely, in the charged particle beam drawing apparatus 10 of the fifth embodiment, the block frame unit data corresponding to the block frames DPB01a to DPB12a (see FIG. 6) formed by the distributor 10b1b1 (see FIG. 11) is used for the shot dividing process, and is used by the pattern area density distribution calculating portion 10b1c (see FIG. 11). Accordingly, the charged particle beam drawing apparatus 10 of the fifth embodiment can decrease a whole of processing load of the distributor 10b1b1 (see FIG. 11), and can decrease transfer time of the drawing data D (see FIG. 11) from the input portion 10b1a (see FIG. 11) to the distributor 10b1b1 (see FIG. 11) than the charged particle beam drawing apparatus 10 of the first embodiment in which the distributor 10b1b2 (see FIG. 2) is provided.

Also, in the charged particle beam drawing apparatus 10 of the fifth embodiment, because the proximity effect correction is not performed in the first pass of the multi-pass writing corresponds to the drawing of the stripe layer STL1 (see FIG. 10A), it is not necessary to perform the calculation of the pattern area density distribution by the pattern area density distribution calculating portion 10b1c (see FIG. 11) before starting the first pass corresponding to the drawing of the stripe layer STL1 (see FIG. 10A), and it is not necessary to perform the calculation of the proximity effect correction dose by the proximity effect correction dose calculating portion 10b1d (see FIG. 11) before starting the first pass corresponding to the drawing of the stripe layer STL1 (see FIG. 10A). Accordingly, the charged particle beam drawing apparatus 10 of the fifth embodiment can start the drawing of the patterns PA1, PA2, PA3 (see FIG. 5), etc. included in the block frame DPB01a (see FIG. 6) earlier than the charged particle beam drawing apparatus 10 of the first embodiment, in which the calculation of the pattern area density distribution is performed by the pattern area density distribution calculating portion 10b1c (see FIG. 2) and the calculation of the proximity effect correction dose is performed by the proximity effect correction dose calculating portion 10b1d (see FIG. 2), before starting the first pass corresponding to the drawing of the stripe layer STL1 (see FIG. 10A).

In the charged particle beam drawing apparatus 10 of the fifth embodiment, the pattern area density distribution calculating portion 10b1c (see FIG. 11) performs the calculation of the pattern area density distribution used for the calculation of the proximity effect correction dose by using a plurality of meshes, wherein a size of each mesh is 1 μm×1 μm, for example, and the pattern area density distribution calculating portion 10b1c (see FIG. 11) performs the calculation of the pattern area density distribution used for the calculation of the fogging effect correction dose by using a plurality of large meshes, wherein a size of each mesh is 10 μm×10 μm, for example. Whereas, in the charged particle beam drawing apparatus 10 of a sixth embodiment, the pattern area density distribution calculating portion 10b1c (see FIG. 11) performs the calculation of the pattern area density distribution used for the calculation of the proximity effect correction dose, and used for the calculation of the fogging effect correction dose, by using a plurality of common meshes, wherein a size of each mesh is 1 μm×1 μm, for example.

FIG. 12 shows the control computer 10b1 of the charged particle beam drawing apparatus 10 of a seventh embodiment, in detail. In the charged particle beam drawing apparatus 10 of a sixth embodiment, as shown in FIG. 11, the proximity effect correction dose calculating portion 10b1d and the fogging effect correction dose calculating portion 10b1e are respectively provided. Whereas, in the charged particle beam drawing apparatus 10 of the seventh embodiment, as shown in FIG. 12, a correction dose calculating portion 10b1de for calculating a correction dose on the basis of the pattern area density distribution calculated by the pattern area density distribution calculating portion 10b1c, wherein at least the proximity effect correction dose and the fogging effect correction dose are integrated into the correction dose. And the pattern area density distribution calculating portion 10b1c (see FIG. 12) performs the calculation of the pattern area density distribution used for the calculation of the correction dose by the correction dose calculating portion 10b1de (see FIG. 12), by using a plurality of meshes, wherein a size of each mesh is 1 μm×1 μm, for example.

In detail, in the charged particle beam drawing apparatus 10 of the seventh embodiment, as shown in FIG. 12, a predetermined dose of the charged particle beam 10a1b (see FIG. 3) is applied for drawing the patterns PA1, PA2, PA3 (see FIG. 5), etc. corresponding to the figures FG1, FG2, FG3 (see FIG. 4), etc. included in the drawing data D (see FIG. 2), on the resist in the whole of the drawing area DA (see FIG. 5) of the workpiece M (see FIG. 5) during or before the calculation of the correction dose by the correction dose calculating portion 10b1de, wherein the correction dose is not incorporated in the predetermined dose, and wherein at least the proximity effect correction dose and the fogging effect correction dose are integrated into the correction dose. And then, a predetermined dose of the charged particle beam 10a1b (see FIG. 3) is applied for drawing the patterns PA1, PA2, PA3 (see FIG. 5), etc. on the resist in the whole of the drawing area DA (see FIG. 5) of the workpiece M (see FIG. 5) after the calculation of the correction dose by the correction dose calculating portion 10b1de, wherein the correction dose is incorporated in the predetermined dose, and wherein at least the proximity effect correction dose and the fogging effect correction dose are integrated into the correction dose, and wherein the patterns PA1, PA2, PA3 (see FIG. 5), etc. drawn after the calculation of the correction dose by the correction dose calculating portion 10b1de overlap the patterns PA1, PA2, PA3 (see FIG. 5), etc. drawn during or before the calculation of the correction dose by the correction dose calculating portion 10b1de, and wherein shape of the patterns PA1, PA2, PA3 (see FIG. 5), etc. drawn after the calculation of the correction dose by the correction dose calculating portion 10b1de is the same as shape of the patterns PA1, PA2, PA3 (see FIG. 5), etc. drawn during or before the calculation of the correction dose by the correction dose calculating portion 10b1de.

In detail, in the charged particle beam drawing apparatus 10 of the seventh embodiment, when the first pass of the 4 pass writing corresponding to the drawing of the stripe layer STL1 (see FIG. 10A) is performed, the predetermined dose of the charged particle beam 10a1b (see FIG. 3) is applied, wherein the correction dose is not incorporated in the predetermined dose. Whereas, in a variation of the charged particle beam drawing apparatus 10 of the seventh embodiment, when the first pass of the 4 pass writing corresponding to the drawing of the stripe layer STL1 (see FIG. 10A) is performed, a predetermined dose of the charged particle beam 10a1b (see FIG. 3) is applied, wherein the proximity effect correction dose calculated by the correction dose calculating portion 10b1ed (see FIG. 12) is incorporated in the predetermined dose, and wherein at least the fogging effect correction dose is not incorporated in the predetermined dose.

Namely, in the variation of the charged particle beam drawing apparatus 10 of the seventh embodiment, the correction dose calculating portion 10b1ed (see FIG. 12) calculates the correction dose on the basis of the pattern area density distribution calculated by the pattern area density distribution calculating portion 10b1c (see FIG. 12), wherein at least the proximity effect correction dose and the fogging effect correction dose are integrated into the correction dose. Also, the correction dose calculating portion 10b1ed (see FIG. 12) calculates the proximity effect correction dose on the basis of the pattern area density distribution calculated by the pattern area density distribution calculating portion 10b1c (see FIG. 12), for the first pass of the 4 pass writing corresponding to the drawing of the stripe layer STL1 (see FIG. 10A).

Also, in the variation of the charged particle beam drawing apparatus 10 of the seventh embodiment, after the calculation of the proximity effect correction dose by the correction dose calculating portion 10b1de (see FIG. 12), and during or before the calculation of the correction dose by the correction dose calculating portion 10b1de (see FIG. 12), wherein at least the proximity effect correction dose and the fogging effect correction dose are integrated into the correction dose, the predetermined dose of the charged particle beam 10a1b (see FIG. 3) is applied for drawing the patterns PA1, PA2, PA3 (see FIG. 5), etc. corresponding to the figures FG1, FG2, FG3 (see FIG. 4), etc. included in the drawing data D (see FIG. 2), on the resist in the whole of the drawing area DA (see FIG. 5) of the workpiece M (see FIG. 5), wherein the proximity effect correction dose is incorporated in the predetermined dose, and wherein the fogging effect correction dose is incorporated in the predetermined dose. And then, after the calculation of the proximity effect correction dose by the correction dose calculating portion 10b1de (see FIG. 12), and after effect correction dose by the correction dose calculating portion 10b1de (see FIG. 12), and during or before the calculation of the correction dose by the correction dose calculating portion 10b1de (see FIG. 12), wherein at least the proximity effect correction dose and the fogging effect correction dose are integrated into the correction dose, the second pass, the third pass and the fourth pass of the 4 pass writing corresponding to the drawing of the stripe layers STL2, STL3, STL4 (see FIGS. 10B, 10C and 10D) are performed, so that a predetermined dose of the charged particle beam 10a1b (see FIG. 3) is applied for drawing the patterns PA1, PA2, PA3 (see FIG. 5), etc. on the resist in the whole of the drawing area DA (see FIG. 5) of the workpiece M (see FIG. 5), wherein the correction dose is incorporated in the predetermined dose, and wherein at least the proximity effect correction dose and the fogging effect correction dose are integrated into the correction dose, and wherein shape of the patterns PA1, PA2, PA3 (see FIG. 5), etc. drawn by the second pass, the third pass and the fourth pass of the 4 pass writing corresponding to the drawing of the stripe layers STL2, STL3, STL4 (see FIGS. 10B, 10C and 10D) is the same as shape of the patterns PA1, PA2, PA3 (see FIG. 5), etc. drawn by the first pass of the 4 pass writing corresponding to the drawing of the stripe layer STL1 (see FIG. 10A).

In detail, in the charged particle beam drawing apparatus 10 of the seventh embodiment, the distributor 10b1b1 (see FIG. 12) forms the block frame unit data corresponding to the block frame DPB01a (see FIG. 6). Whereas, in the variation of the charged particle beam drawing apparatus 10 of the seventh embodiment, the distributor 10b1b1 (see FIG. 12) forms the block frame unit data corresponding to the block frame DPB01b (see FIG. 8A) which is larger than the block frame DPB01a (see FIG. 6), in order to perform the proximity effect correction when the first pass of the 4 pass writing corresponding to the drawing of the stripe layer STL1 (see FIG. 10A) is performed.

In the charged particle beam drawing apparatus 10 of an eighth embodiment, above mentioned first to seventh embodiments, variation, and examples are appropriately combined.

As many apparently widely different embodiments of this invention may be made without departing from the spirit and scope thereof, it is to be understood that the invention is not limited to the specific embodiments thereof except as defined in the appended claims.

What is claimed is:

1. A charged particle beam drawing apparatus, comprising:
a pattern area density distribution calculating portion, of a computer, for calculating a first pattern area density distribution used for calculation of a proximity effect correction dose, and a second pattern area density distribution used for calculation of a fogging effect correction dose, wherein the first pattern area density distribution has a first mesh size, and wherein the second pattern area density distribution has a second mesh size, and wherein the second mesh size is different from the first mesh size;
a proximity effect correction dose calculating portion, of the computer, for calculating the proximity effect correction dose, on the basis of the first pattern area density distribution calculated by the pattern area density distribution calculating portion;
a fogging effect correction dose calculating portion, of the computer, for calculating the fogging effect correction dose, on the basis of the proximity effect correction dose calculated by the proximity effect correction dose calculating portion, and the second pattern area density distribution calculated by the pattern area density distribution calculating portion;
a drawing portion configured to draw patterns corresponding to figures included in a drawing data, in a drawing area of a workpiece, by irradiating the workpiece with a charged particle beam, wherein the workpiece is formed by applying a resist to an upper surface of the workpiece, and wherein after the calculation of the proximity effect correction dose by the proximity effect correction dose calculating portion, and before a result of the calculation of the fogging effect correction dose by the fogging effect correction dose calculating portion is obtained, a first predetermined dose of the charged particle beam is applied for drawing the patterns in a whole of the drawing area of the workpiece, wherein the proximity effect correction dose is incorporated in the first predetermined dose, and the fogging effect correction dose is not incorporated in the first predetermined dose, and wherein after the calculation of the proximity effect correction dose by the proximity effect correction dose calculating portion, and after the calculation of the fogging effect correction dose by the fogging effect correction dose calculating portion, a second predetermined dose of the charged particle beam is applied for drawing the patterns in the whole of the drawing area of the workpiece, wherein the proximity effect correction dose and the fogging effect correction dose are incorporated in the second predetermined dose, and wherein the patterns drawn after the calculation of the fogging effect correction dose overlap the patterns drawn before the result of the calculation of the fogging effect correction dose is obtained, and wherein a shape of the patterns drawn after the calculation of the fogging effect correction dose is the same as a shape of the patterns drawn before the result of the calculation of the fogging effect correction dose is obtained;

a deflection control portion configured to control the drawing portion such that after the calculation of the proximity effect correction dose by the proximity effect correction dose calculating portion, and before the result of the calculation of the fogging effect correction dose by the fogging effect correction dose calculating portion is obtained, the first predetermined dose of the charged particle beam is applied for drawing the patterns in a whole of the drawing area of the workpiece, wherein the proximity effect correction dose is incorporated in the first predetermined dose, and the fogging effect correction dose is not incorporated in the first predetermined dose, and wherein after the calculation of the proximity effect correction dose by the proximity effect correction dose calculating portion, and after the calculation of the fogging effect correction dose by the fogging effect correction dose calculating portion, the second predetermined dose of the charged particle beam is applied for drawing the patterns in the whole of the drawing area of the workpiece, wherein the proximity effect correction dose and the fogging effect correction dose are incorporated in the second predetermined dose, and wherein the patterns drawn after the calculation of the fogging effect correction dose overlap the patterns drawn before the result of the calculation of the fogging effect correction dose is obtained, and wherein the shape of the patterns drawn after the calculation of the fogging effect correction dose is the same as the shape of the patterns drawn before the result of the calculation of the fogging effect correction dose is obtained;

a shot data forming portion, of the computer, for performing a shot dividing process and forming a shot data;

a first distributor, of the computer, for reading a data of figures corresponding to a first block frame from the drawing data corresponding to the whole of the drawing area of the workpiece, and forming a block frame unit data corresponding to the first block frame, wherein the block frame unit data corresponding to the first block frame is used for the shot dividing process; and a second distributor, of the computer, for reading a data of figures corresponding to a second block frame from the drawing data corresponding to the whole of the drawing area of the workpiece, and forming a block frame unit data corresponding to the second block frame, wherein the second block frame is larger than the first block frame, and wherein the block frame unit data corresponding to the second block frame is used by the pattern area density distribution calculating portion.

2. A charged particle beam drawing apparatus, comprising:

a pattern area density distribution calculating portion, of a computer, for calculating a pattern area density distribution used for calculation of a correction dose;

a correction dose calculating portion, of the computer, for calculating the correction dose on the basis of the pattern area density distribution calculated by the pattern area density distribution calculating portion, and for calculating a proximity effect correction dose on the basis of the pattern area density distribution calculated by the pattern area density distribution calculating portion, wherein at least the proximity effect correction dose and a fogging effect correction dose are integrated into the correction dose;

a drawing portion configured to draw patterns corresponding to figures included in a drawing data, in a drawing area of a workpiece, by irradiating the workpiece with a charged particle beam, wherein the workpiece is formed by applying a resist to an upper surface of the workpiece, and wherein after the calculation of the proximity effect correction dose by the correction dose calculating portion, and before a result of the calculation of the correction dose by the correction dose calculating portion is obtained, a first predetermined dose of the charged particle beam is applied for drawing the patterns in a whole of the drawing area of the workpiece, wherein the proximity effect correction dose is incorporated in the first predetermined dose, and the correction dose is not incorporated in the first predetermined dose, and wherein after the calculation of the proximity effect correction dose by the correction dose calculating portion, and after the calculation of the correction dose by the correction dose calculating portion, a second predetermined dose of the charged particle beam is applied for drawing the patterns in the whole of the drawing area of the workpiece, wherein the correction dose is incorporated in the second predetermined dose, and wherein the patterns drawn after the calculation of the correction dose overlap the patterns drawn before the result of the calculation of the correction dose is obtained, and wherein a shape of the patterns drawn after the calculation of the correction dose is the same as a shape of the patterns drawn before the result of the calculation of the correction dose is obtained;

a deflection control portion configured to control the drawing portion such that after the calculation of the proximity effect correction dose by the correction dose calculating portion, and before the result of the calculation of the correction dose by the correction dose calculating portion is obtained, the first predetermined dose of the charged particle beam is applied for drawing the patterns in the whole of the drawing area of the workpiece, wherein the proximity effect correction dose is incorporated in the first predetermined dose, and the correction dose is not incorporated in the first predetermined dose, and wherein after the calculation of the proximity effect correction dose by the correction dose calculating portion, and after the calculation of the correction dose by the correction dose calculating portion, the second predetermined dose of the charged particle beam is applied for drawing the patterns in the whole of the drawing area of the workpiece, wherein the correction dose is incorporated in the second predetermined dose, and wherein the patterns drawn after the calculation of the correction dose overlap the patterns drawn before the result of the calculation of the correction dose is obtained, and wherein the shape of the patterns drawn after the calculation of the correction dose is the same as the shape of the patterns drawn before the result of the calculation of the correction dose is obtained;

a shot data forming portion, of the computer, for performing a shot dividing process and forming a shot data; and a distributor, of the computer, for reading a data of figures corresponding to a block frame from the drawing data corresponding to the whole of the drawing area of the workpiece, and forming a block frame unit data corresponding to the block frame, wherein the block frame unit data corresponding to the block frame is used by the pattern area density distribution calculating portion, and is used for the shot dividing process.

3. A control method of a charged particle beam drawing apparatus for drawing patterns corresponding to figures included in a drawing data, in a drawing area of a workpiece, by irradiating the workpiece with a charged particle beam, by means of multi-pass writing, wherein the workpiece is formed by applying a resist to an upper surface of the workpiece, comprising:

reading a data of figures corresponding to a first block frame from the drawing data corresponding to a whole of the drawing area of the workpiece, by a first distributor, in order to form a block frame unit data corresponding to the first block frame, wherein the block frame unit data corresponding to the first block frame is used for a shot dividing process;

reading a data of figures corresponding to a second block frame from the drawing data corresponding to the whole of the drawing area of the workpiece, by a second distributor, in order to form a block frame unit data corresponding to the second block frame, wherein the second block frame is larger than the first block frame, and wherein the block frame unit data corresponding to the second block frame is used by a pattern area density distribution calculating portion;

performing the shot dividing process by a shot data forming portion, in order to form a shot data;

calculating a first pattern area density distribution used for calculation of a proximity effect correction dose, and a second pattern area density distribution used for calculation of a fogging effect correction dose, by the pattern area density distribution calculating portion, wherein the first pattern area density distribution has a first mesh size, and wherein the second pattern area density distribution has a second mesh size, and wherein the second mesh size is different from the first mesh size;

calculating the proximity effect correction dose by a proximity effect correction dose calculating portion, on the basis of the first pattern area density distribution calculated by the pattern area density distribution calculating portion;

calculating the fogging effect correction dose by a fogging effect correction dose calculating portion, on the basis of the proximity effect correction dose calculated by the proximity effect correction dose calculating portion, and the second pattern area density distribution calculated by the pattern area density distribution calculating portion;

applying a first predetermined dose of the charged particle beam to the workpiece in order to draw the patterns in the whole of the drawing area of the workpiece, after the calculation of the proximity effect correction dose by the proximity effect correction dose calculating portion, and before a result of the calculation of the fogging effect correction dose by the fogging effect correction dose calculating portion is obtained, wherein the proximity effect correction dose is incorporated in the first predetermined dose, and the fogging effect correction dose is not incorporated in the first predetermined dose; and applying a second predetermined dose of the charged particle beam to the workpiece in order to draw the patterns in the whole of the drawing area of the workpiece, after the calculation of the proximity effect correction dose by the proximity effect correction dose calculating portion, and after the calculation of the fogging effect correction dose by the fogging effect correction dose calculating portion, wherein the proximity effect correction dose and the fogging effect correction dose are incorporated in the second predetermined dose, and wherein the patterns drawn after the calculation of the fogging effect correction dose overlap the patterns drawn before the result of the calculation of the fogging effect correction dose is obtained, and wherein a shape of the patterns drawn after the calculation of the fogging effect correction dose is the same as a shape of the patterns drawn before the result of the calculation of the fogging effect correction dose is obtained.

4. A control method of a charged particle beam drawing apparatus for drawing patterns corresponding to figures included in a drawing data, in a drawing area of a workpiece, by irradiating the workpiece with a charged particle beam, by means of multi-pass writing, wherein the workpiece is formed by applying a resist to an upper surface of the workpiece, comprising:

reading a data of figures corresponding to a block frame from the drawing data corresponding to a whole of the drawing area of the workpiece, by a distributor, in order to form a block frame unit data corresponding to the block frame, wherein the block frame unit data corresponding to the block frame is used by a pattern area density distribution calculating portion, and is used for a shot dividing process;

performing the shot dividing process by a shot data forming portion, in order to form a shot data;

calculating a pattern area density distribution used for calculation of a correction dose, by the pattern area density distribution calculating portion;

calculating the correction dose and a proximity effect correction dose, by a correction dose calculating portion, on the basis of the pattern area density distribution calculated by the pattern area density distribution calculating portion, wherein at least the proximity effect correction dose and a fogging effect correction dose are integrated into the correction dose;

applying a first predetermined dose of the charged particle beam to the workpiece in order to draw the patterns in the whole of the drawing area of the workpiece, after the calculation of the proximity effect correction dose by the correction dose calculating portion, and before a result of the calculation of the correction dose by the correction dose calculating portion is obtained, wherein the proximity effect correction dose is incorporated in the first predetermined dose, and the correction dose is not incorporated in the first predetermined dose; and applying a second predetermined dose of the charged particle beam in order to draw the patterns in the whole of the drawing area of the workpiece, after the calculation of the proximity effect correction dose by the correction dose calculating portion, and after the calculation of the correction dose by the correction dose calculating portion, wherein the correction dose is incorporated in the second predetermined dose, and wherein the patterns drawn after the calculation of the correction dose overlap the patterns drawn before the result of the calculation of the correction dose is obtained, and wherein a shape of the patterns drawn after the calculation of the correction dose is the same as a shape of the patterns drawn before the result of the calculation of the correction dose is obtained.

* * * * *